(12) United States Patent
Hanna et al.

(10) Patent No.: US 7,847,284 B2
(45) Date of Patent: Dec. 7, 2010

(54) ORGANIC SEMICONDUCTOR MATERIAL, ORGANIC SEMICONDUCTOR STRUCTURE, AND ORGANIC SEMICONDUCTOR DEVICE

(75) Inventors: Jun-Ichi Hanna, Yokohama (JP); Teppei Shimakawa, Fujisawa (JP); Masanori Akada, Tokyo-To (JP); Hiroki Maeda, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/508,479

(22) PCT Filed: Mar. 26, 2003

(86) PCT No.: PCT/JP03/03744

§ 371 (c)(1),
(2), (4) Date: Sep. 21, 2004

(87) PCT Pub. No.: WO03/080732

PCT Pub. Date: Oct. 2, 2003

(65) Prior Publication Data

US 2005/0127354 A1  Jun. 16, 2005

(30) Foreign Application Priority Data

Mar. 26, 2002 (JP) ............................. 2002-085593

(51) Int. Cl.
*H01L 51/30* (2006.01)
(52) U.S. Cl. .......... 257/40; 257/E51.006; 257/E51.025; 257/E51.028
(58) Field of Classification Search .................. 257/40, 257/E51.001–E51.052; 252/299.01–299.7; 438/99
See application file for complete search history.

(56) References Cited

U.S. PATENT DOCUMENTS

| 5,212,269 | A | * | 5/1993 | Fischer et al. ................ 526/266 |
| 5,341,012 | A | * | 8/1994 | Misawa et al. ............... 257/351 |
| 5,861,109 | A | * | 1/1999 | Goodby et al. ......... 252/299.65 |
| 6,218,061 | B1 | * | 4/2001 | Hanna et al. ............. 430/58.05 |

(Continued)

FOREIGN PATENT DOCUMENTS

JP 11-14995 A 1/1999

(Continued)

OTHER PUBLICATIONS

Funahashi and Hanna. "Anomalous High Carrier Mobility in Smectic E Phase of a 2-Phenelnaphthalene Derivative." Appl. Phys. Lett. vol. 73 (1998): 3733-3735.*

(Continued)

*Primary Examiner*—Matthew W Such
(74) *Attorney, Agent, or Firm*—Harness, Dickey & Pierce, P.L.C.

(57) ABSTRACT

There are provided an organic semiconductor material, which can constitute an organic semiconductor layer having homogeneous and a high level of charge transfer characteristics over a large area, and an organic semiconductor structure and an organic semiconductor device utilizing the organic semiconductor material. The organic semiconductor material comprises a polymeric compound and a monomeric compound, the polymeric compound having, in a part of its side chain, a core structure comprising a predetermined π electron ring, the monomeric compound having a core structure comprising a predetermined π electron ring, the monomeric compound having, in at least one of its both ends, a terminal group capable of developing liquid crystallinity.

21 Claims, 2 Drawing Sheets

U.S. PATENT DOCUMENTS

| | | | |
|---|---|---|---|
| 6,224,787 B1 * | 5/2001 | Hanna et al. | 252/299.3 |
| 6,312,769 B1 * | 11/2001 | Hiraoka et al. | 428/1.1 |
| 6,330,049 B1 * | 12/2001 | Kume et al. | 349/156 |
| 6,461,885 B1 * | 10/2002 | Lupo et al. | 438/29 |
| 6,491,990 B1 * | 12/2002 | Parri et al. | 428/1.1 |
| 6,511,612 B1 * | 1/2003 | Hall et al. | 252/299.01 |
| 6,614,501 B1 * | 9/2003 | Moriyama et al. | 349/177 |
| 6,723,394 B1 * | 4/2004 | Sirringhaus et al. | 428/1.1 |
| 6,773,626 B2 * | 8/2004 | Sanada et al. | 252/299.01 |
| 6,897,913 B2 * | 5/2005 | Tsuboyama et al. | 349/61 |
| 2002/0070662 A1 * | 6/2002 | Moriyama et al. | 313/504 |
| 2002/0076511 A1 * | 6/2002 | Sanada et al. | 428/1.1 |
| 2002/0128341 A1 * | 9/2002 | Sakai et al. | 522/1 |
| 2004/0026660 A1 * | 2/2004 | Vaughan-Spickers et al. | 252/299.01 |
| 2005/0179003 A1 * | 8/2005 | Heckmeier et al. | 252/299.01 |

FOREIGN PATENT DOCUMENTS

| | | | |
|---|---|---|---|
| JP | 2001-302578 | | 4/2000 |
| JP | 2001-294623 A | | 10/2001 |
| WO | 00/06666 A1 | | 2/2000 |
| WO | WO 0006666 A1 | * | 2/2000 |
| WO | WO 00/79617 | | 12/2000 |
| WO | WO 01/42391 | | 6/2001 |
| WO | WO 0157157 A1 | * | 8/2001 |

OTHER PUBLICATIONS

Saielli, G., et al. "Solvation Dynamics of Courmarin 503 in the Liquid-Crystal Mixture ZLI 1167." J. Chem. Soc., Faraday Trans., vol. 94, No. 1 (1998): pp. 121-128.*

Kim, Y.B. and Ban, B.S. "Surface Morphology at Nanometer Level and Optical Phase Retardation of Rubbed Alignment Films." Liquid Crystals, vol. 26, No. 11 (1999): pp. 1579-1585.*

International Search Report for PCT/JP03/03744; ISA/JP; Mailed: Jul. 15, 2003.

Supplementary European Search Report dated Sep. 1, 2010 in corresponding EP Application No. 03715435.

* cited by examiner

ORGANIC SEMICONDUCTOR MATERIAL, ORGANIC SEMICONDUCTOR STRUCTURE, AND ORGANIC SEMICONDUCTOR DEVICE

CROSS-REFERENCE TO RELATED APPLICATIONS

This application is a national phase application of PCT/JP03/03744 filed on Mar. 26, 2003, which claims priority to JP 2002-085593, filed on Mar. 26, 2002.

TECHNICAL FIELD

The present invention relates to a liquid crystalline polymeric organic semiconductor material, a polymeric organic semiconductor structure formed of the polymeric organic semiconductor material, and an organic semiconductor device.

BACKGROUND ART

Thin-film transistors (also known as "organic TFT") utilizing an organic semiconductor in an active layer (hereinafter referred to as "organic semiconductor layer") may be mentioned as typical elements for constituting organic semiconductor devices.

In the thin-film transistors, the organic semiconductor layer is formed by forming a film of a molecular crystal typified by pentacene in vacuo. Regarding the formation of the organic semiconductor layer by the film formation in vacuo, there is a report that the optimization of the film formation conditions can realize the formation of an organic semiconductor layer having a high level of charge mobility exceeding 1 $cm^2/V \cdot s$ (Y. -Y. Lin, D. J. Gundlach, S. Nelson, and T. N. Jackson, "Stacked Pentacene Layer Organic Thin-Film Transistors with Improved Characteristics," IEEE Electron Device Lett. 18, 606 (1997)). The organic semiconductor layer formed by the film formation in vacuo, however, is generally in a polycrystal form composed of aggregates of fine crystals. Therefore, many grain boundaries are likely to exist, and, in addition, defects are likely to occur. The grain boundaries and defects inhibit the transfer of charges. For this reason, in the formation of the organic semiconductor layer by film formation in vacuo, the organic semiconductor layer as the element for constituting the organic semiconductor device could not have been substantially continuously produced in a satisfactory wide area with homogeneous properties without difficulties.

On the other hand, a discotic liquid crystal is known as a material having a high level of charge mobility (D. Adam, F. Closss, T. Frey, D. Funhoff, D. Haarer, H. Ringsdorf, P. Schunaher, and K. Siemensmyer, Phys. Rev. Lett., 70, 457 (1993)). In this discotic liquid crystal, however, charge transfer is carried out based on a one-dimensional charge transfer mechanism along the columnar molecular alignment. Therefore, close control of the molecular alignment is required, and this disadvantageously makes it difficult to utilize the discotic liquid crystal on a commercial scale. Any example of success in thin-film transistors using the discotic liquid crystal as a material for constituting the organic semiconductor layer has not been reported yet.

A high level of charge mobility in a liquid crystal state of rodlike liquid crystalline materials such as phenylbenzothiazole derivatives has already been reported (M. Funahashi and J. Hanna, Jpn. J. Appl. Phys., 35, L703-L705 (1996)). Up to now, however, there is no report on any example of success of thin-film transistors utilizing the rodlike liquid crystalline material in the organic semiconductor layer. The rodlike liquid crystalline material exhibits a few types of liquid crystal states, and the charge mobility is likely to increase with enhancing the regularity of the structure of the liquid crystalline material. The transition of the liquid crystalline material to a crystal state having a higher level of regularity of structure, however, results in lowered or no charge mobility. In this case, of course, no properties required of the thin-film transistor are developed.

For the utilization of the liquid crystalline material in a liquid crystal state having a high level of charge mobility, in use, the liquid crystal material should be sealed in a glass cell or the like. This imposes restrictions on device production. Further, the rodlike liquid crystalline material exhibits liquid crystallinity only at relatively high temperatures and thus cannot be utilized at a temperature around room temperature (about −10 to 40° C.).

When a molecular dispersion polymeric material is used as an organic semiconductor material, an organic semiconductor layer, which has uniform charge transfer characteristics over a large area can be formed by coating this organic semiconductor material. The organic semiconductor layer thus formed, however, has a low charge mobility of $10^{-5}$ to $10^{-6}$ $cm^2/V \cdot s$, and, disadvantageously, the charge mobility depends upon temperatures and electric fields.

The present inventors have solved the above problem by providing, in Japanese Patent Application No. 32772/2002, an organic semiconductor structure having, in at least a part thereof, an organic semiconductor layer comprising an aligned liquid crystalline organic semiconductor material, the liquid crystalline organic semiconductor material having a core comprising L 6 π electron aromatic rings, M 10 π electron aromatic rings, and N 14 π electron aromatic rings, wherein L, M, and N are each an integer of 0 (zero) to 4 and L+M+N=1 to 4, the liquid crystalline organic semiconductor material exhibiting at least one liquid crystal state at a temperature below the heat decomposition temperature thereof.

The above organic semiconductor structure, however, is formed from a liquid crystalline organic semiconductor material which is a nonpolymeric material. The following report is the sole report about organic semiconductor materials which are polymeric materials, and effective organic semiconductor materials have not yet been found. That is, there is no report about an organic semiconductor structure and an organic semiconductor layer having effective charge transfer characteristics.

Specifically, for example, M. Redecker and D.D.C. Bradley, Applied Physics Letters, vol. 74, 10, 1999 reports polymeric semiconductor materials having a high level of charge mobility around room temperature. According to this literature, a polymeric semiconductor material having a high level of mobility can be prepared by providing a polymer having a long conjugated system on its main chain, heating the polymer to a temperature at which a nematic phase is developed, and then rapidly cooling the polymer to form a glassy polymer with a nematic state fixed thereto. In particular, it is reported that a high level of mobility can be realized in the case where the above procedure is carried out in such a state that the material is in contact with an aligning film formed by subjecting a polyimide film to rubbing treatment.

On the other hand, at the present time, any polymeric material having a conjugated molecule on its side chain, which exhibits a high level of charge mobility, is not known. The reason for this is that, in the main chain type polymeric semiconductor, electronic conduction proceeds along the main chain having a long conjugated system, whereas, in the side chain type polymeric semiconductor, the conjugated systems in the side chain molecules overlap with each other and charges are transferred by hopping conduction between side chain molecules.

Further, any material capable of successfully controlling the overlap of side chain molecules with each other have not hitherto been known in the art, and a high level of charge mobility could not be provided. The degree of freedom in constitutive property can be improved by increasing the chain length of an alkyl group, which connects the main chain to the π conjugated aromatic ring, to increase the degree of freedom. Increasing the chain length of the alkyl group, which connects the main chain to the π conjugated aromatic ring, inevitably results in the introduction of a large amount of material not involved in electronic conduction and consequently could not contribute to a satisfactory improvement in charge mobility.

The present invention has been made with a view to solving the above problems of the prior art, and an object of the present invention is to provide an organic semiconductor material having a high level of homogenous charge mobility over a large area, which has hitherto been regarded as difficult of achieve, and to provide an organic semiconductor structure and an organic semiconductor device utilizing the organic semiconductor material.

DISCLOSURE OF THE INVENTION

The above object of the present invention can be attained by an organic semiconductor material comprising a polymeric compound and a monomeric compound, said polymeric compound having, in a part of its side chain, a core structure comprising a π electron ring selected from a group consisting of L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6, said monomeric compound having a core structure comprising a π electron ring selected from said group of π electron rings, said monomeric compound having, in at least one of its both ends, a terminal group capable of developing liquid crystallinity.

In an embodiment of the present invention, the π electron ring of the core in the side chain of the polymeric compound is preferably the same as the π electron ring of the core of the monomeric compound. However, the π electron ring of the core in the side chain of the polymeric compound may be different from the π electron ring of the core of the monomeric compound when the energy level involved in the charge transfer of the π electron ring of the core in the side chain of the polymeric compound is substantially same as the energy level involved in the charge transfer of the π electron ring of the core of the monomeric compound.

According to another aspect of the present invention, there is provided an organic semiconductor material comprising a polymeric compound and a monomeric compound, said polymeric compound having, in a part of its main chain, a core structure comprising a π electron ring selected from a group consisting of L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6, said monomeric compound having a core structure comprising a π electron ring selected from said group of π electron rings, said monomeric compound having, in at least one of its both ends, a terminal group capable of developing liquid crystallinity.

In an embodiment of the present invention, the π electron ring of the core in the main chain of the polymeric compound is preferably the same as the π electron ring of the core of the monomeric compound. However, the π electron ring of the core in the main chain of the polymeric compound may be different from the π electron ring of the core of the monomeric compound when the energy level involved in the charge transfer of the π electron ring of the core in the main chain of the polymeric compound is substantially same as the energy level involved in the charge transfer of the π electron ring of the core of the monomeric compound.

Preferably, any of the above organic semiconductor materials has at least one smectic liquid crystal phase state at a temperature below the heat decomposition temperature, and, preferably, the monomeric compound or the polymeric compound has at least one smectic liquid crystal phase state at a temperature below the heat decomposition temperature.

According to still another aspect of the present invention, there is provided an organic semiconductor structure comprising an organic semiconductor layer formed of the above organic semiconductor material, wherein, when said organic semiconductor layer is held at such a temperature that said organic semiconductor material exhibits a smectic liquid crystal phase followed by rapid cooling from said temperature, said organic semiconductor layer has a liquid crystal glass state.

According to a further aspect of the present invention, there is provided an organic semiconductor structure comprising an organic semiconductor layer formed of the above organic semiconductor material, wherein, when said organic semiconductor layer is held at such a temperature that said organic semiconductor material exhibits a smectic liquid crystal phase followed by gradual cooling from said temperature, at least a part of said organic semiconductor layer has a crystal state.

The organic semiconductor layer may be formed in contact with a liquid crystal aligning layer. The formation of the organic semiconductor layer in contact with the liquid crystal aligning layer can provide a structure having excellent charge transfer properties based on molecular orientation.

Preferably, the liquid crystal aligning layer is formed of a material selected from the group consisting of polychloropyrene, polyethylene terephthalate, polyoxymethylene, polyvinyl chloride, polyvinylidene fluoride, cyanoethyl pullulan, polymethyl methacrylate, polysulfone, polycarbonate, and polyimide, or is formed of a curing resin having fine concaves and convexes on its surface, or is formed of a substrate and a curing resin having fine concaves and convexes on its surface and, due to the contact of the organic semiconductor material with the liquid crystal aligning layer, the organic semiconductor material is anisotropically oriented in a specific direction.

Preferably, the organic semiconductor material is anisotropically oriented in such a direction that, in said core structure, the direction of overlap of electron orbits is coincident with the charge transport direction.

In the organic semiconductor structure, preferably, the organic semiconductor layer has an electron mobility of not less than $10^{-5}$ cm$^2$/V·s or a hole transport mobility of not less than $10^{-5}$ cm$^2$/V·s.

According to another aspect of the present invention, there is provided an organic semiconductor device comprising a substrate, a gate electrode, a gate insulating layer, an organic semiconductor layer, a drain electrode, and a source electrode, the organic semiconductor layer being formed of the above organic semiconductor material.

Preferably, the organic semiconductor layer has an electron mobility of not less than $10^{-5}$ cm$^2$/V·s or a hole transport mobility of not less than $10^{-5}$ cm$^2$/V·s.

In a further aspect of the present invention, there is provided use of the above organic semiconductor structure as an organic transistor, an organic EL, an organic electronic device, or an organic solar cell.

BEST MODE FOR CARRYING OUT THE INVENTION

Figure 1:
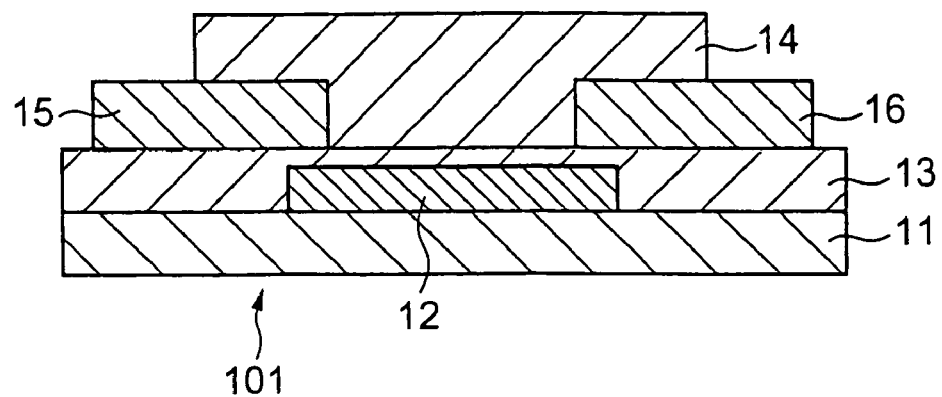
FIG. 1 is a cross-sectional view showing an embodiment of the organic semiconductor device according to the present invention.

The organic semiconductor material, the organic semiconductor structure, and the organic semiconductor device according to the present invention will be described in more detail.

1. Organic Semiconductor Material

The organic semiconductor material according to the present invention is an organic semiconductor material comprising a polymeric compound and a monomeric compound. The polymeric compound has, in a part of its side chain or main chain, a core structure comprising a π electron ring which will be described later. The monomeric compound has a core structure comprising a π electron ring, which will be described later, and has, in at least one of its both ends, a terminal group capable of developing liquid crystallinity.

When the π electron ring constitutes the core structure and a polymeric compound having the core structure on its side chain or main chain is used as the organic semiconductor material, due to the degree of freedom of the three-dimensional structure of the polymeric compound, π electron rings constituting the side chain or the main chain can interact with each other. When a monomeric compound having a core of a π electron is blended into this polymeric compound, due to the degree of freedom of the monomeric compound, these π electron rings further interact with each other. As a result, a molecular state, in which conjugated aromatic rings overlap with each other, can be realized. This facilitates the transfer of charges by hopping conduction in the overlapped portion and can develop a high level of charge transfer properties. In particular, in the present invention, the organic semiconductor material, which exhibits a smectic phase of a high order structure, can form an organic semiconductor layer having a very high level of crystallinity and thus is advantageous in the formation of an organic semiconductor structure having a higher level of charge transfer properties. Further, the organic semiconductor material is fluid at such a temperature that can maintain the liquid crystal state and thus can be coated in this state. As a result, an organic semiconductor layer and an organic semiconductor device having a high level of charge transfer properties can be formed homogeneously in a large area.

In the present invention, the core structure of the monomeric compound may be the same or different from the core structure of the side chain or main chain of the polymeric compound. Preferably, however, the π electron ring of the core structure constituting the side chain or main chain of the polymeric compound is the same as the π electron ring of the core structure in the monomeric compound.

At the outset, the core structure constituting the monomeric compound the core structure constituting the polymeric compound will be described.

(1) Core Structure

The core structure is selected from the group consisting of L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings. Specifically, 6 π electron rings include, for example, benzene, furan, thiophene, pyrrole, 2H-pyran, 4H-thiopyran, pyridine, oxazole, isoxazole, thiazole, isothiazole, furazane, imidazole, pyrazole, pyrazine, pyrimidine, and pyridazine rings. 8 π electron rings include, for example, pentalene, indene, indolizine, and 4H-quinolizine rings. 10 π electron rings include, for example, naphthalene, azulene, benzofuran, isobenzofuran, 1-benzothiophene, 2-benzothiophene, indole, isoindole, 2H-chromene, 1H-2-benzopyran, quinoline, isoquinoline, 1,8-naphthyridine, benzimidazole, 1H-indazole, benzoxazole, benzothiazole, quinoxaline, quinazoline, cinnoline, pteridine, purine, and phthalazine rings. 12 π electron rings include, for example, heptalene, biphenylene, as-indacene, s-indacene, acenaphthylene, fluorene, and phenalene rings. 14 π electron rings include, for example, phenanthrene, anthracene, carbazole, xanthene, acridine, phenanthridine, perimidine, 1,10-phenanthroline, phenazine, phenarsazine, and tetrathiafulvalene rings. 16 π electron rings include, for example, fluoranthene, acephenanthrylene, aceanthrylene, pyrene, thianthrene, phenoxathiine, phenoxazine, and phenothiazine rings. 18 π electron rings include, for example, triphenylene, chrysene, naphthacene, and pleiadene rings. 20 π electron rings include, for example, perylene ring. 22 π electron rings include, for example, picene, pentaphene, and pentacene rings. 24 π electron rings include, for example, tetraphenylene and coronene rings. 26 π electron rings include, for example, hexaphene, hexacene, and rubicene rings.

Core structures having these aromatic rings in a part thereof include, for example, structures represented by chemical formulae 1 to 34.

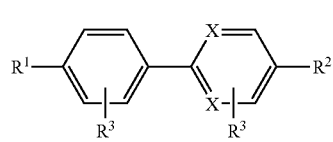

Formula 1

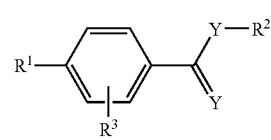

Formula 2

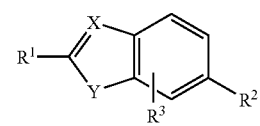

Formula 3

Formula 4
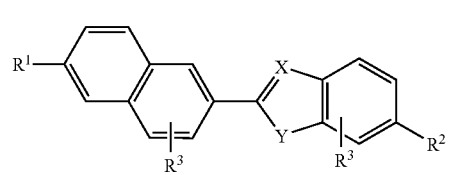
Formula 5
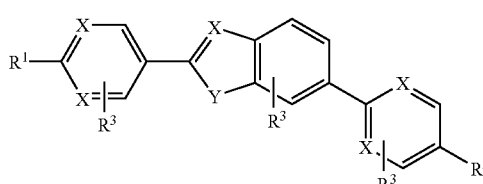
Formula 6
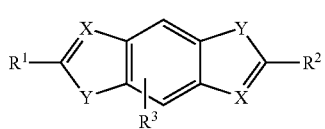
Formula 7
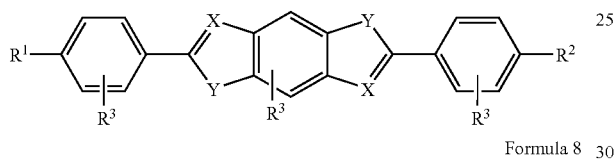
Formula 8
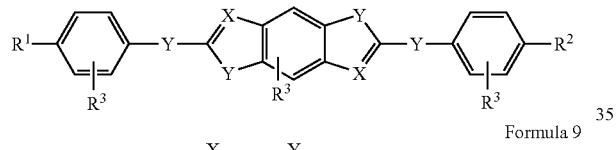
Formula 9
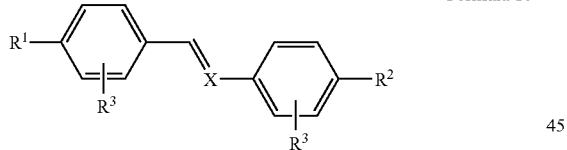
Formula 10
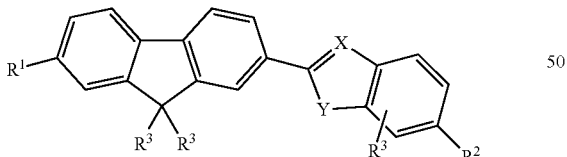
Formula 11
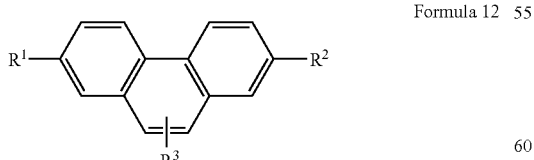
Formula 12
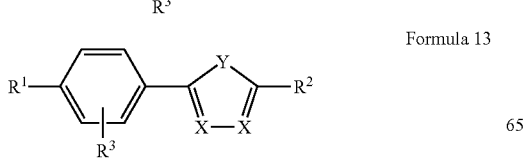
Formula 13
Formula 14
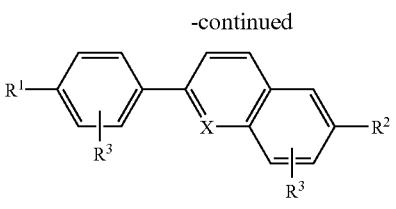
Formula 15
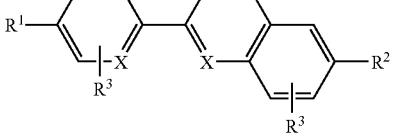
Formula 16
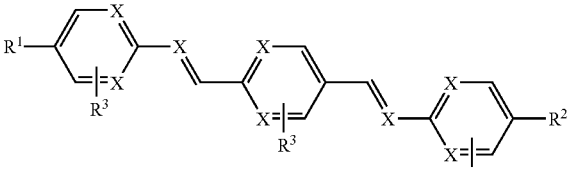
Formula 17
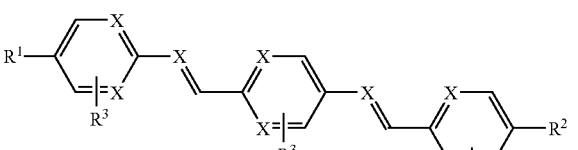
Formula 18
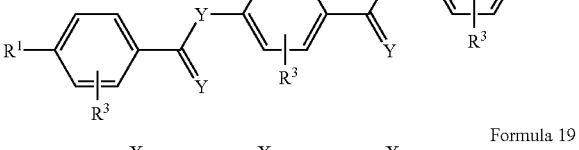
Formula 19
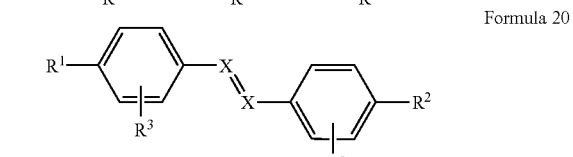
Formula 20
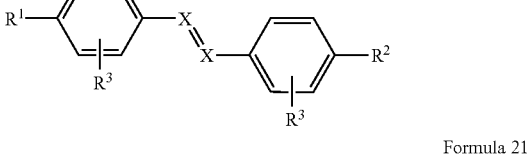
Formula 21
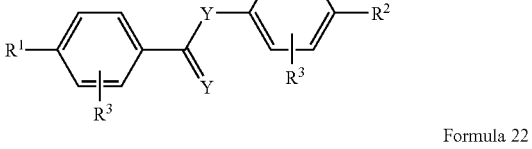
Formula 22
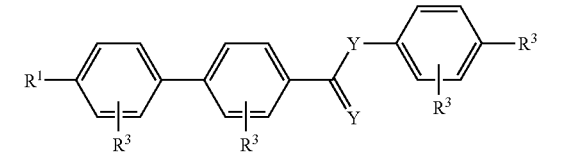

-continued

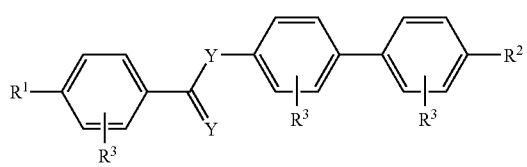
Formula 23

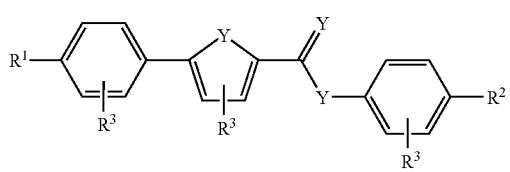
Formula 24

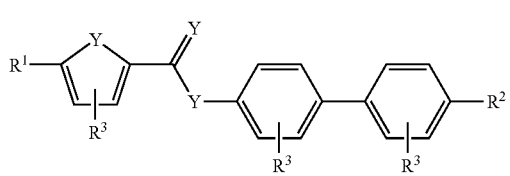
Formula 25

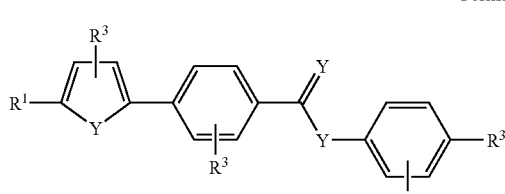
Formula 26

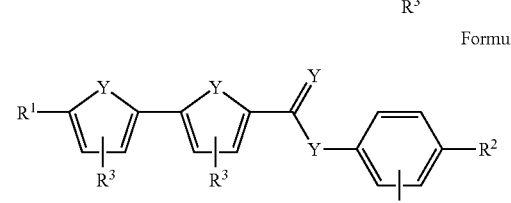
Formula 27

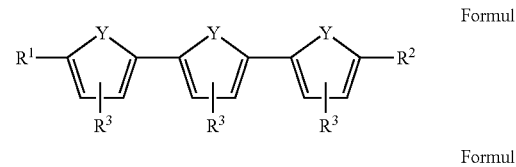
Formula 28

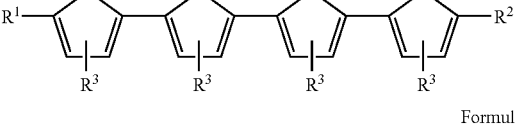
Formula 29

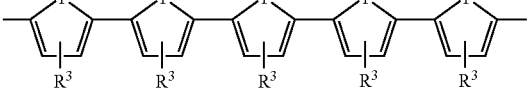
Formula 30

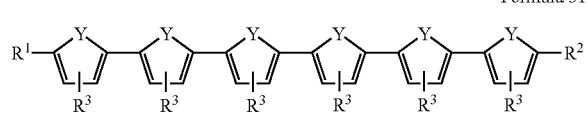
Formula 31

-continued

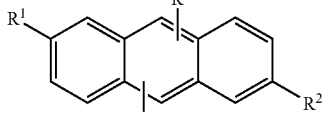
Formula 32

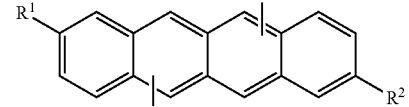
Formula 33

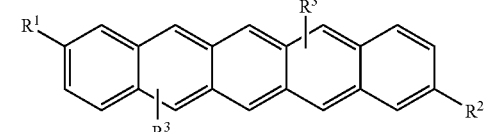
Formula 34

In the above formulae, $R^1$ and $R^2$ represent the following terminal structure; $R^3$'s, which may be the same or different, represent a trifluoromethyl group, an alkyl group, a nitro group, a halogen atom, or a hydrogen atom; X represents CH or N; and Y represents S or O.

A specific example of the terminal structure of $R^1$ and $R^2$ is one in which the rigid core structure has on its one end any one of H (a hydrogen atom), a halogen atom, a cyano group, a nitro group, a hydroxyl group and the like and on its other end a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. In this case, examples of substituents include halogen atoms or cyano, sulfo, alkoxycarbonyl, alkoxy, hydroxy, aryloxy, acyloxy, aryl, and acyl groups.

Further, the terminal structure may be such that the core structure has on its both ends a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. In this case, examples of substituents include halogen atoms or cyano, sulfo, alkoxycarbonyl, alkoxy, hydroxy, aryloxy, acyloxy, aryl, and acyl groups.

(2) Monomeric Compound

The monomeric compound constituting the organic semiconductor material according to the present invention will be described. The monomeric compound has the above-described core structure and has, in at least one of both ends of the core structure, a terminal structure (referred to also as "terminal group") which develops liquid crystalinity.

A specific example of the terminal structure is one in which the above rigid core structure has on its one end any one of H (a hydrogen atom), a halogen atom, a cyano group, a nitro group, a hydroxyl group and the like and on its other end a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. In this case, examples of substituents include halogen atoms or cyano, sulfo, alkoxycarbonyl, alkoxy, hydroxy, aryloxy, acyloxy, aryl, and acyl groups.

Further, the terminal structure may be such that the core structure has on its both ends a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. In this case, examples of substituents include halogen atoms or cyano, sulfo, alkoxycarbonyl, alkoxy, hydroxy, aryloxy, acyloxy, aryl, and acyl groups.

Since the monomeric compound having the above structure, even after blending with a polymeric compound which will be described later, has a high degree of freedom, conjugated aromatic rings having the above core structure interact with each other so as to overlap with each other.

More preferably, the monomeric compound has at least one smectic liquid crystal phase state at a temperature below the heat decomposition temperature. In this case, due to self-organizing, molecular alignment is likely to occur spontaneously, resulting in crystal-like alignment. The monomeric compound having the above characteristic function, even in the form of a blend with the polymeric compound which will be described later, takes a liquid crystal structure like a smectic phase and develops a high level of charge transfer properties.

(3) Polymeric Compound

The polymeric compound constituting the organic semiconductor material according to the present invention will be described. The polymeric compound has the above core structure in a part of the side chain or the main chain.

Examples of polymeric compounds include side chain type homopolymers having a structure represented by formula 35 or formula 36, side chain type copolymers having a structure represented by formula 37, and main chain type polymers having a structure represented by formula 38 or formula 39.

The side chain type polymeric compound applied in the present invention is not limited to those exemplified by formulae 35 to 37, and polymeric compounds, which have any one of core structures represented by formulae 1 to 34 in a part of the side chain and have any of the above terminal structures at both ends of the core structure, can be preferably applied. In order that the side chain constituting the polymeric compound is easily aligned with a high degree of freedom, in formula 37, preferably, n=100 to 67% and m=0 to 33%.

The main chain type polymeric compound applied in the present invention is not limited to polymeric compounds exemplified by chemical formulae 38 and 39 and may be any polymeric compound which has a core structure represented by any one of formulae 1 to 34 in the main chain and any of the above terminal structures at both ends of the core structure.

Further, in the side chain type polymeric compound, the main chain may be constituted by an alkyl-based chain exemplified by formulae 35 to 37. The main chain structure is not particularly limited so far as the side chain having the above core structure and terminal structure can be easily aligned with a satisfactorily high degree of freedom. In this case, 100 to 67% of all of the side chains provided in the main chain is preferably the side chain having the above core structure. This permits the side chain having the core structure and the terminal structure to be more easily aligned with a satisfactory degree of freedom.

More preferably, the above polymeric compound has at least one smectic liquid crystal phase state at a temperature below the heat decomposition temperature.

In the polymeric compound having the above main chain and side chain, after blending with the above monomeric compound, core structures common to both the polymeric compound and the monomeric compound overlap with each other, leading to a high level of charge transfer properties.

Formula 35

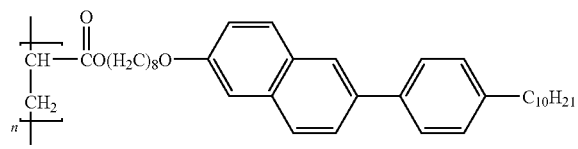

Formula 36

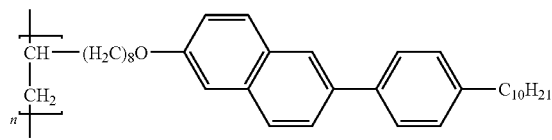

Formula 37

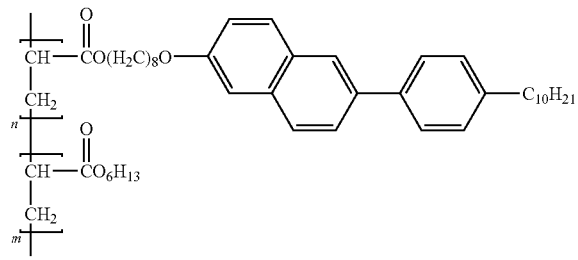

Formula 38

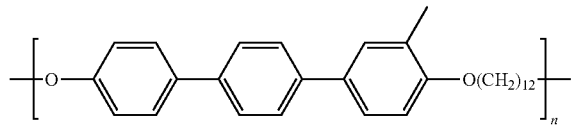

Formula 39

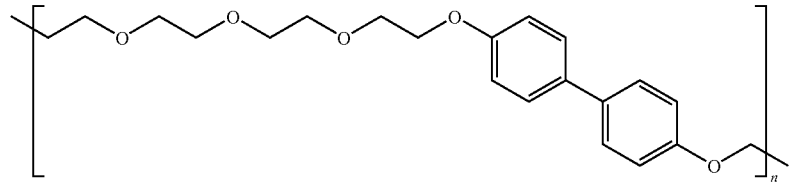

(4) Organic Semiconductor Material

The organic semiconductor material according to the present invention comprises a blend of the above monomeric compound with the above polymeric compound. The blending ratio between the monomeric compound and the polymeric compound varies greatly depending upon the structure of the monomeric compound and the structure of the polymeric compound. In general, however, the blending ratio between the monomeric compound and the polymeric compound is preferably monomeric compound:polymeric compound=1:1 to 1:100 (molar ratio). The liquid crystalline organic semiconductor material according to the present invention has the above core structure in a part of its side chain or main chain and thus has a degree of three-dimensional freedom. Further, blending this polymeric compound with a monomeric compound, with a high degree of freedom, having the same core structure as the polymeric compound causes mutual overlapping of the conjugated aromatic rings.

Further, preferably, the organic semiconductor material has at least one smectic liquid crystal phase state at a temperature below the heat decomposition temperature. Since the development of the liquid crystal state is possible, spontaneous molecular alignment can be realized by self-organization and, as a result, crystal-like alignment is provided. Therefore, when an organic semiconductor layer is formed using the organic semiconductor material according to the present invention which can realize the development of a smectic phase-like structure, the transfer of charges by hopping conduction between adjacent molecules can be facilitate and a high level of charge transfer properties can be developed. Both the above-described monomeric compound and polymeric compound constituting the organic semiconductor material preferably have a smectic liquid crystal phase state. However, the monomeric compound or polymeric compound may not have a smectic liquid crystal phase state so far as a smectic liquid crystal phase state is developed upon mixing of both the compounds.

The organic semiconductor material according to the present invention exhibits at least one type of liquid crystal state at a temperature below the heat decomposition temperature. The expression "at a temperature below the heat decomposition temperature" refers to such a state that the organic semiconductor material per se is not thermally decomposed. The heat decomposition temperature varies depending upon organic semiconductor materials applied. Further, the expression "at least one type of liquid crystal state" means that, even when a monomeric compound, which exhibits a plurality of liquid crystal states, or a monomeric compound having a non-liquid-crystal state portion is applied, a material, which exhibits at least one type of liquid crystal state, is used. For example, a smectic (hereinafter referred to also as "Sm") liquid crystal, which will be described later, exhibits a plurality of liquid crystal states of SmA phase, SmB phase, SmC phase, SmD phase . . . , and the material to be used should exhibit at least one of these liquid crystal states.

In particular, in the present invention, an organic semiconductor material, which develops a smectic phase having a structure of a high order, can form an organic semiconductor layer having a very high level of crystallinity. This is advantageous for the formation of an organic semiconductor structure showing a higher level of charge transfer properties. Further, since the organic semiconductor material is fluid at such a temperature that the liquid crystal state can be maintained, the organic semiconductor material can be coated in the liquid crystal state. Thereafter, when an organic semiconductor structure is formed by means which will be described later, an organic semiconductor layer having a high level of charge transfer properties can be formed homogeneously in a large area.

2. Organic Semiconductor Structure

The organic semiconductor structure according to the present invention has an organic semiconductor layer formed of the organic semiconductor material according to the present invention. The organic semiconductor structure may be formed by the following two means.

In the first means, the organic semiconductor structure is formed by holding the organic semiconductor layer at such a temperature that the organic semiconductor material exhibits a smectic liquid crystal phase and then rapid cooling the organic semiconductor layer from the temperature. In the organic semiconductor structure thus formed, the smectic phase having a structure of a high order (a high level of constitutive property) is fixed in a liquid crystal glass state. The organic semiconductor layer thus formed has a high level of charge transfer properties. The formation of the organic semiconductor layer in contact with a liquid crystal aligning layer can realize the provision of a structure having excellent charge transfer properties based on molecular alignment.

In this first means, the rate of rapid cooling from such a temperature region that the organic semiconductor material can maintain or experience the smectic liquid crystal phase is not less than 50° C./min to 20° C./min. Whether or not the resultant organic semiconductor structure is in a glass state can be judged by comparing the texture observed under a polarization microscope with the texture in the liquid crystal state.

According to the second means, the organic semiconductor structure is formed by holding the above organic semiconductor layer at such a temperature that the organic semiconductor material can maintain or experience a smectic liquid crystal phase and then gradually cooling the organic semiconductor layer from that temperature. At least a part of the organic semiconductor structure thus formed is in a crystallized state, and a wide-range high-level orderliness can be realized. When the organic semiconductor material is gradually cooled, the crystal size of the organic semiconductor material is increased and a high level of charge mobility can be developed. In particular, a higher level of charge mobility can be realized when the crystal size is larger than the electrode spacing involved in charge transfer. When the organic semiconductor layer is formed in contact with the liquid crystal aligning layer, a structure having excellent charge transfer properties based on molecular alignment can be provided.

In this second means, it is preferred that the organic semiconductor material be stacked on a liquid crystal aligning layer formed of a polyimide material and aligned, or that the organic semiconductor material be stacked on a liquid crystal aligning layer formed of a curing resin having fine concaves and convexes on its surface and aligned, or that the organic semiconductor material be stacked on a substrate and a liquid crystal aligning layer formed of a curing resin having fine concaves and convexes on its surface and aligned.

In this second means, the rate of gradual cooling from such a temperature region that the organic semiconductor material can be maintained or passed through the smectic liquid crystal phase is 10° C./min to 0.1° C./min. When the rate of gradual cooling is less than 0.1° C./min, the necessary cooling time becomes disadvantageously too long. When the rate of gradual cooling exceeds 10° C./min, structure defects with respect to charge transfer caused by rapid volume contraction of the crystal phase disadvantageously take place. Whether or not a part of the organic semiconductor structure is in a crystallized state can be determined by observation under a polarization microscope or by X-ray diffractometry. The proportion of the crystallized part is preferably 100 to 80%. In this case, the crystal size is preferably several tens to several hundreds of micrometers in terms of average crystal grain diameter as measured under a polarization microscope.

In both the first means and the second means, the organic semiconductor material is fluid at such a temperature that the liquid crystal state can be maintained, and, thus, can be coated in this state. According to this method, an organic semiconductor layer having homogeneous charge transfer properties over a large area can be very easily formed. In this case, various coating methods and printing methods can be applied for coating. In the present specification, the crystal phase or the crystal state refers to that the liquid crystalline organic semiconductor material is in the state of aggregation at a temperature below the liquid crystal-crystal phase transition temperature.

In the organic semiconductor structure according to the present invention described above, preferably, the organic semiconductor material has smetic liquid crystallinity at a temperature below the heat decomposition temperature, and the organic semiconductor layer formed of the organic semiconductor material has an electron mobility of not less than $10^{-5}$ cm$^2$/V·s or a hole transport mobility of not less than $10^{-5}$ cm$^2$/V·s.

(1) Liquid Crystal Aligning Means

Among the organic semiconductor structures according to the present invention, the organic semiconductor layer in the organic semiconductor structure formed by the second means is formed by gradually cooling the organic semiconductor material which has been subjected to anisotropic alignment in a specific direction by aligning means.

Examples of the aligning means include the formation of a liquid crystal aligning layer on an organic semiconductor material forming face (a layer forming face, for example, a surface of a gate insulating layer which will be described later), aligning treatment such as rubbing treatment and light irradiation, and contact with a layer subjected to alignment treatment. These aligning means can form a liquid crystal phase of the organic semiconductor material with anisotropic alignment in a specific direction. Therefore, functionalities and electric characteristics characteristic of the orientation or direction of the alignment of the liquid crystal phase can be developed in the formed organic semiconductor layer.

Various liquid crystal aligning layers can be applied for liquid crystal alignment purposes. In the organic semiconductor structure according to the present invention, however, the liquid crystal aligning layer is preferably any one of a layer formed by coating a polyimide material and then subjecting the coating to rubbing treatment, a layer formed by coating a polyimide material and then exposing the coating to light, a layer formed of a cured resin having fine concaves and convexes, and a layer which is formed of a cured resin having fine concaves and convexes and functions also as a substrate. The alignment by external field such as electric field or magnetic field is also possible.

A typical liquid crystal aligning layer is a layer formed by coating a polyimide resin and then subjecting the coating to rubbing treatment. In addition to the polyimide resin, other materials usable herein include resin materials such as acrylic, polychloropyrene, polyethylene terephthalate, polyoxymethylene, polyvinyl chloride, polyvinylidene fluoride, cyanoethyl pullulan, polymethyl methacrylate, polysulfone, polycarbonate, and polyimide resins. These materials can be classified into types which can perpendicularly align the liquid crystal and types which can horizontally align the liquid crystal. Specific examples of coating methods include spin coating, casting, pull-up, transfer, and ink jet methods. The liquid crystal aligning layer may be provided between the substrate and the organic semiconductor layer or on an overcoat overlying the organic semiconductor layer.

The liquid crystal aligning layer formed of a curing resin having fine concaves and convexes may be formed, for example, by forming a layer of a curing resin, either subjecting the surface of the layer to rubbing treatment to form concaves and convexes, or pressing a shaping member capable of forming fine concaves and convexes against the surface of the uncured curing resin layer, and then curing the resin layer. The surface of the curing resin thus obtained has fine concaves and convexes, and the liquid crystal phase of the organic semiconductor material can be oriented in that direction. Curing resins include ultraviolet-curing acrylic resins and ultraviolet-curing fluorocarbon resins. At that time, particularly preferably, the liquid crystal aligning layer formed of a cured resin having fine concaves and convexes is integral with a substrate.

In this case, the fine concaves and convexes comprise fine grooves provided in an identical direction. In the grooves in the concave-convex part, the depth is approximately 0.01 to 1.0 µm, preferably 0.03 to 0.3 µm, the width is approximately 0.05 to 1.0 µm, and the pitch of adjacent grooves is approximately 0.1 to 2.0 µm. When the depth of the grooves is less than 0.01 µm, the liquid crystal molecules cannot be properly aligned. On the other hand, when the depth of the grooves exceeds 1.0 µm, the alignment of the liquid crystal is sometimes disordered at the edge of the grooves. When the width of the grooves is less than 0.05 µm, the preparation of the grooves is difficult. On the other hand, when the width of the grooves exceeds 1.0 µm, the alignment force at the center of the groove is sometimes lowered. When the pitch of the grooves is less than 0.1 µm, the preparation of the grooves is difficult. On the other hand, when the pitch of the grooves exceeds 2.0 µm, the disorder of the alignment of the liquid crystal is likely to occur.

In the organic semiconductor structure according to the present invention, a first embodiment of the liquid crystal aligning layer comprises a substrate, a liquid crystal aligning layer, and an organic semiconductor layer successively stacked in that order. A second embodiment of the liquid crystal aligning layer comprises a substrate, an organic semiconductor layer, and a liquid crystal aligning layer successively stacked in that order. A third embodiment of the liquid crystal aligning layer comprises a substrate, a liquid crystal aligning layer, an organic semiconductor layer, and a liquid crystal aligning layer successively stacked in that order. Thus, in the present invention, when the organic semiconductor layer is constructed in contact with a layer subjected to alignment treatment, a high level of alignment can be imparted to the liquid crystal phase constituting the organic semiconductor material.

3. Organic Semiconductor Device

As shown in FIG. 1, an organic semiconductor device 101 according to the present invention includes at least a substrate 11, a gate electrode 12, a gate insulating layer 13, an organic semiconductor layer 14, a drain electrode 15, and a source electrode 16. In this organic semiconductor device 101, the organic semiconductor layer 14 is formed of an organic semiconductor material constituting the organic semiconductor structure according to the present invention.

Examples of constructions include an inversely staggered structure comprising the substrate 11 and, provided on the substrate 11 in the following order, the gate electrode 12, the gate insulating layer 13, the aligned organic semiconductor layer 14, the drain electrode 15 and the source electrode 16, and a protective film (not shown), and a coplanar structure comprising the substrate 11 and, provided on the substrate 11 in the following order, the gate electrode 12, the gate insulating layer 13, the drain electrode 15 and the source electrode 16, the organic semiconductor layer 14, and a protective film (not shown). The organic semiconductor device 101 having the above construction is operated in a storage or deficiency state according to the polarity of voltage applied to the gate electrode 12. The members constituting the organic semiconductor device will be described in detail.

(1) Substrate

The substrate 11 may be selected from a wide range of insulating materials. Examples of such materials include various insulating materials, for example, inorganic materials such as glasses and alumina sinters, and polyimide films, polyester films, polyethylene films, polyphenylene sulfide films, and polyparaxylene films. In particular, the use of films of polymeric compounds is very useful because lightweight and flexible organic semiconductor devices can be prepared. The thickness of the substrate 11 applied in the present invention is about 25 μm to 1.5 mm.

(2) Gate Electrode

The gate electrode 12 is preferably an electrode formed of an organic material such as polyaniline or polythiophene, or an electrode formed by coating an electrically conductive ink. Since these electrodes can be formed by coating an organic material or an electrically conductive ink, the electrode formation process is advantageously very simple. Specific examples of coating methods include spin coating, casting, pull-up, transfer, and ink jet methods.

When a metallic film is formed as an electrode, a conventional vacuum film formation method can be used. Specifically, a mask film formation method or a photolithographic method may be used. In this case, materials for electrode formation usable herein include inorganic materials, for example, metals such as gold, platinum, chromium, palladium, aluminum, indium, molybdenum, and nickel, alloys using these metals, polysilicon, amorphous silicon, tin oxide, indium oxide, and indium tin oxide (ITO). Two or more of these materials may be used in combination.

The film thickness of the gate electrode is preferably about 50 to 1000 nm, although the film thickness varies depending upon the electrical conductivity of the material. The lower limit of the thickness of the gate electrode varies depending upon the electrical conductivity of the electrode material and the strength of adhesion between the gate electrode and the underlying substrate. The upper limit of the thickness of the gate electrode should be such that, when a gate insulating layer and a source-drain electrode pair which will be described later are provided, the insulation covering by the gate insulating layer in a level difference part between the underlying substrate and the gate electrode is satisfactory and an overlying electrode pattern is not broken. In particular, when a flexible substrate is used, a stress balance should be taken into consideration.

(3) Gate Insulating Layer

As with the gate electrode 12, the gate insulating layer 13 is preferably formed by coating an organic material. Organic materials usable herein include polychloropyrene, polyethylene terephthalate, polyoxymethylene, polyvinyl chloride, polyvinylidene fluoride, cyanobethyl pullulan, polymethyl methacrylate, polysulfone, polycarbonate, and polyimide. Specific examples of coating methods include spin coating, casting, pull-up, transfer, and ink jet methods.

Alternatively, the gate insulating layer may be formed by a conventional pattern process such as CVD. In this case, inorganic materials such as $SiO_2$, SiNx, and $Al_2O_3$ are preferably used. Two or more of these materials may be used in combination.

Since the mobility of the organic semiconductor device depends upon field strength, the thickness of the gate insulating layer is preferably about 50 to 300 nm. In this case, the withstand voltage is preferably not less than 2 MV/cm.

Alternatively, the gate insulating layer may be formed by a conventional pattern process such as CVD. In this case, inorganic materials such as $SiO_2$, SiNx, and $Al_2O_3$ are preferably used. Two or more of these materials may be used in combination.

Since the mobility of the organic semiconductor device depends upon field strength, the thickness of the gate insulating layer is preferably about 50 to 200 nm. In this case, the withstand voltage is preferably not less than 2 MV/cm.

(4) Drain Electrode and Source Electrode

The drain electrode 15 and the source electrode 16 are preferably formed of a metal having a large work function. The reason for this is as follows. Specifically, in the liquid crystalline organic semiconductor material which will be described later, carriers for transporting charges are holes, and, hence, the liquid crystalline organic semiconductor material should be in ohmic contact with the organic semiconductor layer 14. The term "work function" as used herein refers to a potential difference necessary for taking electrons out of the solid to the outside of the solid, and the work function is defined as a difference in energy between vacuum level and Fermi level. The work function is preferably about 4.6 to 5.2 eV, and specific examples of such metals include gold, platinum, and transparent electrically conductive films (for example, indium tin oxide and indium zinc oxide). The transparent electrically conductive film may be formed by sputtering or electron beam (EB) evaporation.

The thickness of the drain electrode 15 and the source electrode 16 applied in the present invention is about 50 to 100 nm.

(5) Organic Semiconductor Layer

The organic semiconductor layer 14 is formed of an organic semiconductor material. Specific organic semiconductor materials, conditions for cooling thereof, alignment treatment, liquid crystal aligning layer and the like are as described above.

The organic semiconductor layer 14 thus formed has such a unique effect that a defect-free, uniform, large-area organic semiconductor layer can be formed. In the organic semiconductor layer 14, more preferably, the electron transport speed is not less than $10^{-5}$ cm$^2$/V·s, or the hole transport speed is not less than $10^{-5}$ cm$^2$/V·s. In order to provide such property values, for example, the type of the organic semiconductor material and conditions are properly studied. This charge transport speed of the organic semiconductor layer 14 can advantageously contribute, for example, to a lowering in drive voltage of organic thin-film transistors or to an improvement in response speed.

When the layer forming face, on which the organic semiconductor material is formed, is a gate insulating layer or a substrate, the gate insulating layer or the substrate may be subjected to rubbing treatment so that the gate insulating layer or the substrate serves also as the alignment treatment film.

(6) Interlayer Insulating Layer

An interlayer insulating layer is preferably provided in the organic semiconductor device 101. The interlayer insulating layer is provided from the viewpoint of preventing contamination of the surface of the gate electrode 12 in forming the drain electrode 15 and the source electrode 16 on the gate insulating layer 13. Therefore, the interlayer insulating layer is formed on the gate insulating layer 13 before the formation of the drain electrode 15 and the source electrode 16. After the formation of the source electrode 15 and the drain electrode 16, the interlayer insulating layer in its part located above the channel region is entirely or partly removed. Preferably, the interlayer insulating layer in its region to be removed has a size equal to the size of the gate electrode 12.

Materials usable for constituting the interlayer insulating layer include inorganic materials such as SiO, SiNx, $Al_2O_3$ and organic materials such as polychloropyrene, polyethylene terephthalate, polyoxymethylene, polyvinyl chloride, polyvinylidene fluoride, cyanoethyl pullulan, polymethyl methacrylate, polysulfone, polycarbonate, and polyimide.

(7) Organic Semiconductor Device

Constructions adoptable in the organic semiconductor device according to the present invention include (i) substrate/gate electrode/gate insulating layer (which serves also as liquid crystal aligning layer)/source-drain electrode/liquid crystalline organic semiconductor layer (/protective layer), (ii) substrate/gate electrode/gate insulating layer/source-drain electrode/liquid crystal aligning layer/liquid crystalline organic semiconductor layer (/protective layer), (iii) substrate/gate electrode/gate insulating layer (which serves also as liquid crystal aligning layer)/liquid crystalline organic semiconductor layer/source-drain electrode (/protective layer), (iv) substrate/gate electrode/gate insulating layer (which serves also as liquid crystal aligning layer)/liquid crystalline organic semiconductor layer/substrate with source-drain electrode patterned thereon (which serves also as protective layer), (v) substrate/source-drain electrode/liquid crystalline organic semiconductor layer/gate insulating layer (which serves also as liquid crystal aligning layer)/gate electrode/substrate (which serves also as protective layer), (vi) substrate (which serves also as aligning layer)/source-drain electrode/liquid crystalline organic semiconductor layer/gate insulating layer/gate electrode/substrate (which serves also as protective layer), and (vii) substrate/gate electrode/gate insulating layer/source-drain electrode/liquid crystalline organic semiconductor layer/substrate (which serves also as aligning layer).

In the above organic semiconductor device, the organic semiconductor layer can be easily formed by coating using the organic semiconductor material according to the present invention.

EXAMPLES

The present invention will be described in more detail with reference to the following Examples.

1. Side Chain Type Polymeric Compound (1) Synthesis of Side Chain Type Homopolymer As shown in the following scheme, octanediol was first subjected to one-end monotosylation, followed by a reaction with bromonaphthol to give a hydroxyl-containing aryl halide (formula 40). The hydroxyl-containing aryl halide was then reacted with arylboric acid by the Suzuki coupling reaction method to give a compound (formula 41). Next, a vinyl monomer (formula 42) was produced through a reaction with acrylic acid chloride under basic conditions, and 3% by mole of AIBN was then added as an initiator to the monomer, followed by radical polymerization to give a target homopolymer 1 (formula 35).

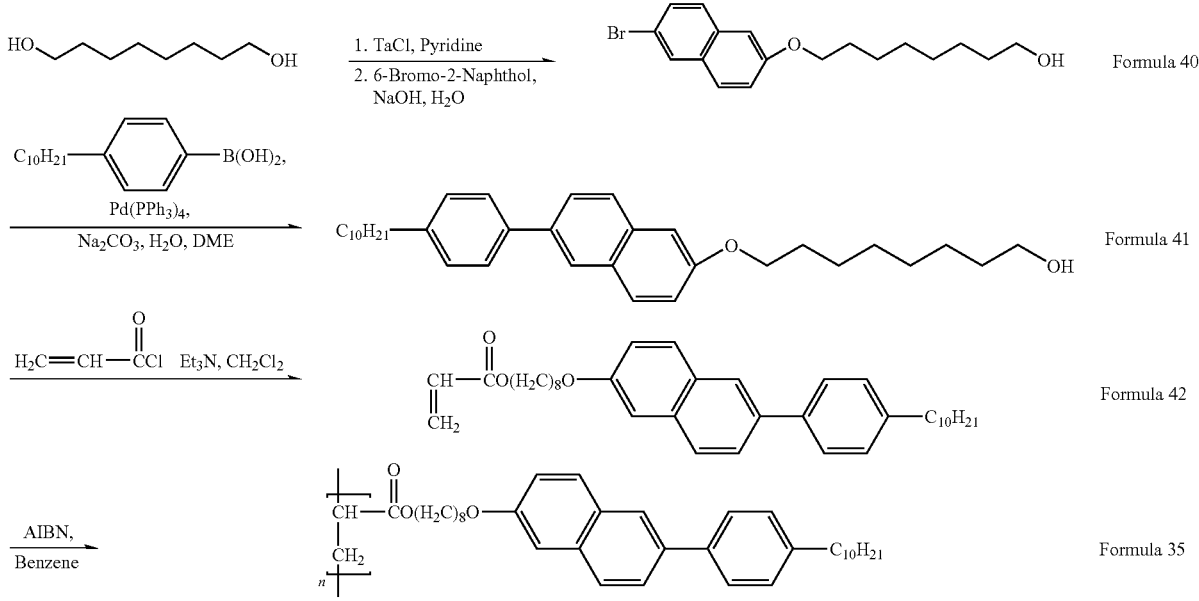

(2) Synthesis of Side Chain Type Copolymer

Octanediol was first subjected to one-end monotosylation, followed by a reaction with bromonaphthol to give a hydroxyl-containing aryl halide (formula 40). The hydroxyl-containing aryl halide was then reacted with arylboric acid by the Suzuki coupling reaction method to give a compound (formula 41). Next, a vinyl monomer (formula 42) was produced through a reaction with acrylic acid chloride under basic conditions and was then mixed with an acrylic ester, and 1% by mole of AIBN was added as an initiator to the vinyl monomer of formula 42, followed by radical polymerization to give a target copolymer 2 (formula 37).

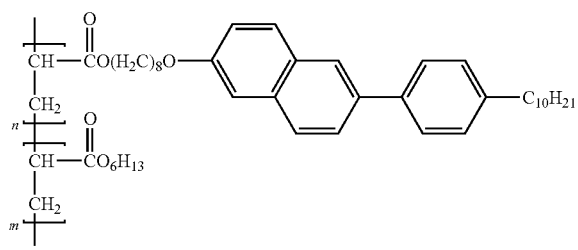

Formula 37

(3) Observation Under Polarization Microscope

For the texture characteristic of the liquid crystal phase, a cell with a liquid crystal injected thereinto was observed under a polarization microscope. As a result, for the organic semiconductor material of the synthesized homopolymer 1 (formula 35), observation under the polarization microscope revealed the presence of domains on the order of several tens of micrometers, indicating that an SmA phase was developed. When this organic semiconductor material was cooled from the SmA phase temperature region, a texture in a liquid crystal glass state, which kept the SmA phase to some extent, was observed around room temperature (25° C.). At that time, there was no difference in texture between rapid cooling and gradual cooling.

(4) DSC (Differential Scanning Calorimetry)

As a result of DSC, it was found that the homopolymer exhibited an SmA phase in the temperature range of 110 to 165° C.

(5) Time-of-Flight Measurement (TOF Method)

Figure 2:
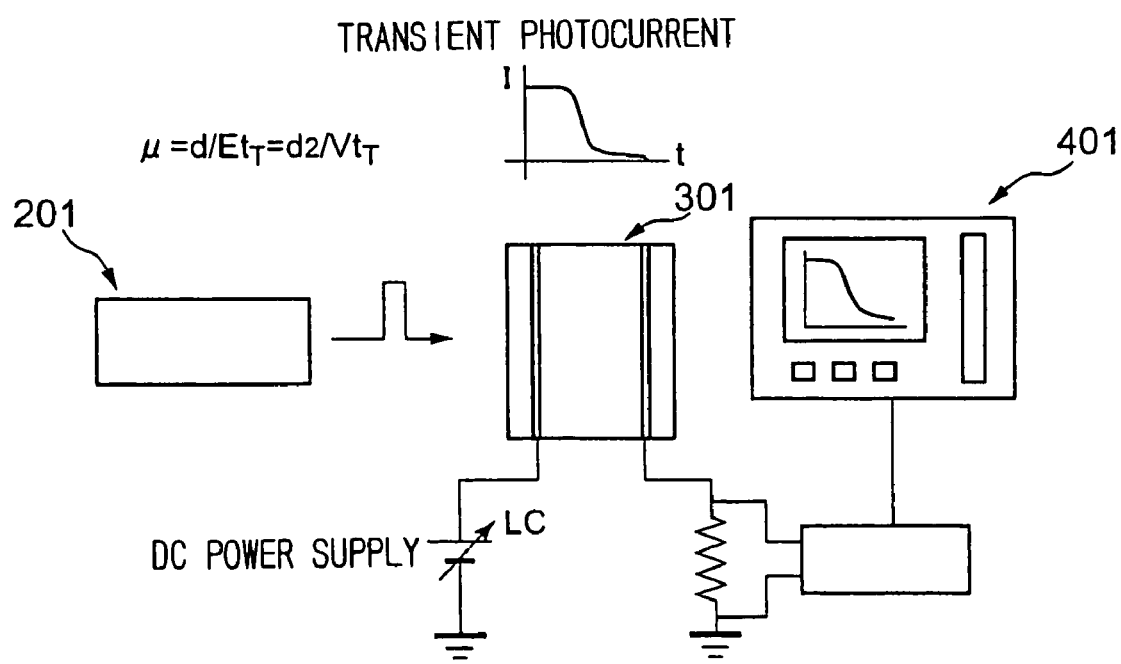
FIG. 2 is a schematic diagram of a time-of-flight method (TOF method), wherein numeral 401 designates a digital oscilloscope.

In this Example, a method was used in which a sample 301 was excited by an $N_2$ pulse laser 201 at a wavelength of 337 nm. FIG. 2 is a schematic diagram showing a commonly used TOF method. As a result of the time-of-flight measurement, in the homopolymer 1, the hole mobility in SmA phase (140° C.) was $2.0 \times 10^{-4}$ cm$^2$/V·s. In the glass state, the structure is considered as similar to the smectic phase. However, the mobility was immeasurable.

2. Main Chain Type Polymeric Compound (1) Synthesis of Main Chain Type Polymeric Compound As shown in the following scheme, a target homopolymer (formula 38) was produced by the Williamson esterification reaction method from a terphenyl having a hydroxyl group at its both ends and an alkane having bromine at its both ends.

Further, as shown in the following scheme, a target homopolymer (formula 39) was produced by the Williamson esterification reaction method from a biphenyl having a hydroxyl group at its both ends and an ether chain having bromine at its both ends.

(2) Observation Under Polarization Microscope

For the texture characteristic of the liquid crystal phase, a cell with a liquid crystal injected thereinto was observed under a polarization microscope. Observation of the aligned texture under a polarization microscope revealed that the polymeric material of formula 38 exhibited a nematic phase at a temperature around 150 to 180° C. The state of crystallites and the liquid crystal glass state varied depending upon the rate of cooling to room temperature.

Observation of the aligned texture under a polarization microscope revealed that the polymeric material of formula 39 exhibited a smectic phase at a temperature around 195 to 210° C. The state of crystallites and the liquid crystal glass state varied depending upon the rate of cooling to room temperature.

(3) DSC (Differential Scanning Calorimetry)

As a result of DSC, it was found that the polymeric compound of formula 38 exhibited a nematic (N) phase in the temperature range of 149.9 to 178.4° C. Further, it was found that the polymeric compound of formula 39 exhibited a smectic phase in the temperature range of 193 to 209° C.

(4) Time-of-Flight Measurement (TOF Method)

The polymeric compound of formula 38 produced by rapid cooling was rapidly cooled to 30° C. to bring the polymeric compound to a liquid crystal glass state. The hole mobility was then measured and found to be $5 \times 10^{-6}$ cm$^2$/V·s. In the state of crystallites produced by gradual cooling, the charge mobility was immeasurable due to weak photocurrent signals.

For the polymeric compound of formula 39, produced by rapid cooling, which exhibits a smectic phase, the mobility was confirmed to be $10^{-4}$ to $10^{-3}$ cm$^2$/V·s. On the other hand, the charge transfer in the crystal phase produced by gradual cooling was not observed.

3. Monomeric Compound

The compound of formula 43 became a crystal state at a temperature of 54° C. or below. This compound exhibited a smectic phase in the temperature range of 55 to 128° C., and the charge mobility was found to be in the range of $1.0 \times 10^{-4}$ cm²/V·s to $1.0 \times 10^{-2}$ cm²/V·s. In the polycrystal phase, charges were trapped in a trap level present in grain boundaries, and the mobility could not be precisely measured.

Formula 43

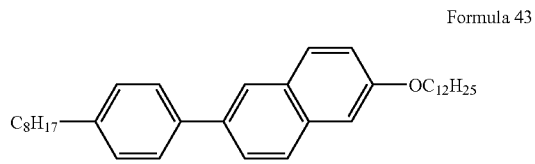

The compound of formula 44 exhibited a nematic phase in a supercooling phase, exhibited a crystal phase at a temperature of 128° C. or below, and did not exhibit a smectic phase. For the isotropic phase and the phase, the charge mobility was on the order of $10^{-5}$ cm²/V·s, and the charge transfer of the crystal phase was immeasurable.

Formula 44

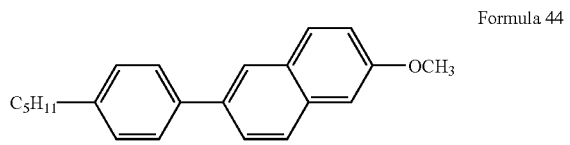

The compound of formula 45 exhibited a crystal phase at a temperature of 70° C. or below and caused phase transition to an isotropic phase at 150° C. This compound exhibited a smectic phase in the intermediate temperature region, and, in this phase, the charge mobility was $5 \times 10^{-4}$ to $7 \times 10^{-3}$ cm²/V·s.

Formula 45

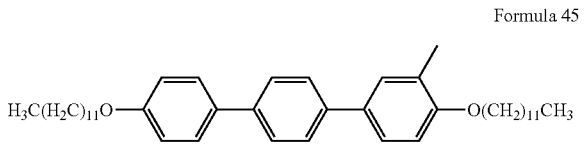

The compound of formula 46 exhibited a crystal phase at a temperature of 57° C. or below and caused phase transition to an isotropic phase at 86° C. This compound exhibited a smectic phase in the intermediate temperature region, and, in this phase, the charge mobility was on the order of approximately $10^{-3}$ cm²/V·S.

Formula 46

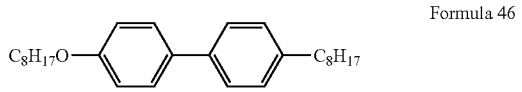

The compound of formula 47 did not exhibit a liquid crystal phase and had a melting point of 66.5° C. The charge transferability was immeasurable.

Formula 47

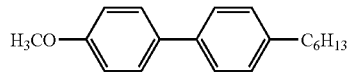

3. Organic Semiconductor Material (Blend of Polymeric Compound/Monomeric Compound)

(1A) Blend of Side Chain Type Polymeric Compound/Monomeric Compound (Where Both the Side Chain Type Polymeric Compound and the Monomeric Compound Have an Identical Core Structure and Have a Smectic Phase)

The side chain type polymeric compound of formula 35 which exhibits a smectic phase and the monomeric compound of formula 43 which exhibits a smectic phase were blended together at a weight ratio of 5:1, and the blend was dissolved in dichloromethane. Since the molecular weight Mw of the acrylic monomer (organic semiconductor material) of formula 42 was 542 and the molecular weight Mw of the monomeric compound of formula 43 was 500, the molar ratio was 4.5:1.

Next, dichloromethane was evaporated at 40° C. and was then dried in vacuo again at 40° C. to give a side chain type polymeric compound/monomeric compound blend material 1 containing a monomeric compound content of 16.7% by weight.

(2A) Side Chain Type Polymeric Compound/Monomeric Compound (Where Both the Side Chain Type Polymeric Compound and the Monomeric Compound Have an Identical Core Structure, and Only the Polymeric Compound Has Smectic Liquid Crystallinity)

The side chain type polymeric compound of formula 35 which exhibits a smectic phase and the monomeric compound of formula 44 which does not exhibit a smectic phase were blended together at a weight ratio of 5:1, and the blend was dissolved in dichloromethane.

Next, dichloromethane was evaporated at 40° C. and was then dried in vacuo again at 40° C. to give a side chain type polymeric compound/monomeric compound blend material 2 containing a monomeric compound content of 16.7% by weight.

(3A) Side Chain Type Polymeric Compound/Monomeric Compound (Where Both the Side Chain Type Polymeric Compound and the Monomeric Compound Have an Identical Core Structure, and Only the Monomeric Compound Has Smectic Liquid Crystallinity)

The side chain type copolymer of formula 37 and the liquid crystalline monomeric compound of formula 43 were blended together at a weight ratio of 5:1, and the blend was dissolved in dichloromethane.

Next, dichloromethane was evaporated at 40° C. and was then dried in vacuo at 40° C. to give a side chain type polymeric compound/monomeric compound blend material 3 containing a monomeric compound content of 16.7% by weight.

(4A) Observation Under Polarization Microscope

For all the blend materials 1 to 3, independently of whether or not the added monomeric compound has liquid crystalline properties, a large number of domains having a size larger than the domains (order of several tens to several hundreds of micrometers) in the crystal phase observed under the polarization microscope of the above polymeric compound alone (not blended with the monomeric compound) were observed. For all the blend materials 1 to 3, by virtue of the presence of large domains, the liquid crystal phase could be easily confirmed, and the development of SmA phase and SmB phase could be confirmed. Further, the texture varied depending upon the cooling start temperature and the cooling rate. The blend material thus obtained was allowed to stand on an iron plate and was rapidly cooled from a temperature zone, at which the SmA phase and the SmB phase were exhibited, to a temperature around room temperature. As a result, textures reflecting the respective phases were observed. The cooling rate was not less than 50° C./min. When the cooling rate was not more than 20° C./min, a texture similar to an SmE phase was observed.

(5A) Measurement of Stationary Photocurrent (20° C.)

Figure 3:
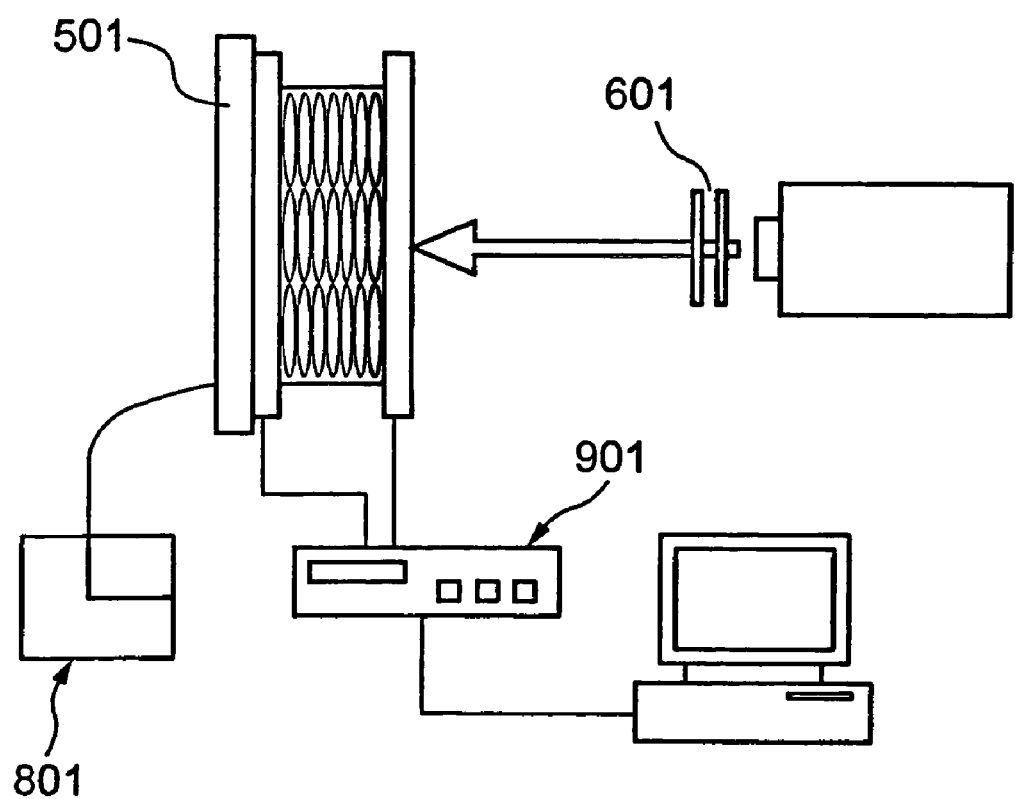
FIG. 3 is a schematic diagram of a stationary photocurrent measuring device, wherein numeral 601 designates an optical filter.

FIG. 3 is a schematic diagram showing a stationary photocurrent measuring device. A sample was fixed onto a hot stage 501 of which the temperature was controlled with a temperature controller 801. A source measuring unit 901 (K 237, Keithley Instruments, Inc.) was used for voltage application and current measurement. A 500-W Xe lamp was used as an irradiation light source, and an on-off operation was carried out with an electromagnetic shutter. This device was used for the measurement of the presence or absence photocurrent, and dark current and amperometric response in the case where DC voltage was applied. The measurement results of the sample cooled at a rate of not less than 50° C./min were compared with the measurement results of the sample cooled at a rate of 0.1° C./min. As a result, the difference in cooling rate did not cause a significant change in waveform, as well as in intensity.

(6A) Time-of-Flight Measurement (Liquid Crystal State at High Temperature)

For the blend materials 1 to 3, the hole mobility was determined from the transient photocurrent in the SmA phase and the SmB phase and was found to be about $2.0 \times 10^{-4}$ $cm^2/V \cdot s$ to $1.0 \times 10^{-2}$ $cm^2/V \cdot s$. This value was about one-half to one-third of the measured value for the polymeric compound alone (not blended with the monomeric compound).

(7A) Time-of-Flight Measurement (Rapidly Cooling Condition)

The blend materials 1 to 3 were cooled from 140° C. to 30° C. at a cooling rate of not less than 50° C./min to prepare liquid crystal glass state samples. The charge mobility of these samples at a temperature around room temperature was about $1.0 \times 10^{-3}$ $cm^2/V \cdot s$ which was substantially the same as the charge mobility in the SmB phase state.

(8A) Time-of-Flight Measurement (Gradual Cooling Condition)

The blend materials 1 to 3 were cooled from 140° C. to 30° C. at a cooling rate of 1° C./min to prepare crystal state samples. The charge mobility of these samples was $4.0 \times 10^{-4}$ $cm^2/V \cdot s$ The above organic semiconductor materials (polymeric compound/monomeric compound blend material) were gradually cooled in contact with an aligning film from the liquid crystal phase to prepare samples having a crystal structure having large domains or a structure similar to the SmE phase. Due to increased domain size, the charge mobility became $1.0 \times 10^{-3}$ $cm^2/V \cdot s$.

(1B) Blend of Main Chain Type Polymeric Compound/ Monomeric Compound (Where Both the Main Chain Type Polymeric Compound and the Monomeric Compound Have an Identical Core Structure)

The main chain type polymeric compound of formula 39 which exhibits a smectic phase and the monomeric compound of formula 46 which exhibits a smectic phase were blended together at a weight ratio of 5:1, and the blend was dissolved in hot toluene.

Next, toluene was evaporated at 110° C. and was then dried in vacuo at 80° C. to give a main chain type polymeric compound/monomeric compound blend material 4 containing a monomeric compound content of 16.7% by weight.

(2B) Main Chain Type Polymeric Compound/Monomeric Compound (Where Both the Main Chain Type Polymeric Compound and the Monomeric Compound Have an Identical Core Structure, and Only the Polymeric Compound Has Smectic Liquid Crystallinity)

The main chain type polymeric compound of formula 39 which exhibits a smectic phase and the monomeric compound of formula 47 which does not exhibit a smectic phase were blended together at a weight ratio of 5:1, and the blend was dissolved in hot toluene.

Next, toluene was evaporated at 110° C. and was then dried in vacuo at 80° C. to give a main chain type polymeric compound/monomeric compound blend material 5 containing a monomeric compound content of 16.7% by weight.

(3B) Main Chain Type Polymeric Compound/Monomeric Compound (Where the Polymeric Compound Does Not Exhibit a Smectic Phase)

The main chain type polymeric compound of formula 38 and the liquid crystalline monomeric compound of formula 45 were blended together at a weight ratio of 5:1, and the blend was dissolved in hot toluene.

Next, toluene was evaporated at 110° C. and was then dried in vacuo at 80° C. to give a main chain type polymeric compound/monomeric compound blend material 6 containing a monomeric compound content of 16.7% by weight.

(4B) Observation Under Polarization Microscope

It was confirmed that all the main chain type polymeric compound/monomeric compound blend materials 4 to 6 in this Example exhibited a smectic phase even in the case where the polymeric compound alone did not exhibit a smectic phase.

(5B) Measurement of Stationary Photocurrent

In the same manner as described above, the presence or absence of photocurrent, and dark current and amperometric response in the case where DC voltage was applied were measured. The measurement results of the sample cooled at a rate of not less than 50° C./min were compared with the measurement results of the sample cooled at a rate of 0.1° C./min. As a result, the difference in cooling rate did not cause a significant change in waveform, as well as in intensity.

(6B) Time-of-Flight Measurement (Liquid Crystal State at High Temperature)

The hole mobility was determined from the transient photocurrent in the two smectic phases in the liquid crystal polymeric compound blend and was found to be about $2.0 \times 10^{-4}$ $cm^2/V \cdot s$ to $3.0 \times 10^{-3}$ $cm^2/V \cdot s$. This value was about one-half to one-third of the measured value for the polymeric compound alone (not blended with the monomeric compound).

(7B) Time-of-Flight Measurement (Rapidly Cooling Condition)

The blend materials 4 to 6 were cooled from 150° C. to 30° C. at a cooling rate of not less than 50° C./min to prepare liquid crystal glass state samples. The mobility of these samples at a temperature around room temperature was about $3.0 \times 10^{-3}$ $cm^2/V \cdot s$ which was substantially the same as the charge mobility in the smectic phase state.

(8B) Time-of-Flight Measurement (Gradual Cooling Condition)

The charge mobility of the samples cooled from 150° C. to 30° C. at a rate of 1° C./min was $5.0 \times 10^{-6}$ $cm^2/V \cdot s$.

The above organic semiconductor materials (blends) were gradually cooled in contact with an aligning film from the liquid crystal phase to prepare samples having a crystal structure having large domains or a structure similar to a high-order Sm phase. Due to increased domain size, the charge mobility became $3.0 \times 10^{-3}$ cm$^2$/V·s.

(1C) Blend of Side Chain Type Polymeric Compound/Monomeric Compound (Where the Side Chain Type Polymeric Compound and the Monomeric Compound are Different from Each other in Core Structure and Both the Side Chain Type Polymeric Compound and the Monomeric Compound Have a Smectic Phase)

The side chain type polymeric compound of formula 35 which exhibits a smectic phase and the monomeric compound of formula 46 which exhibits a smectic phase were blended together at a weight ratio of 5:1, and the blend was dissolved in hot toluene.

Next, toluene was evaporated at 110° C. and was then dried in vacuo at 80° C. to give a side chain type polymeric compound/monomeric compound blend material 7 containing a monomeric compound content of 16.7% by weight.

(2C) Side Chain Type Polymeric Compound/Monomeric Compound (Where the Side Chain Type Polymeric Compound and the Monomeric Compound are Different from each other in Core Structure, and Only the Polymeric Compound Has Smectic Liquid Crystallinity)

The side chain type polymeric compound of formula 35 which exhibits a smectic phase and the monomeric compound of formula 47 which does not exhibit a smectic phase were blended together at a weight ratio of 5:1, and the blend was dissolved in hot toluene.

Next, toluene was evaporated at 40° C. and was then dried in vacuo again at 40° C. to give a side chain type polymeric compound/monomeric compound blend material 8 containing a monomeric compound content of 16.7% by weight.

(3C) Side Chain Type Polymeric Compound/Monomeric Compound (Where the Side Chain Type Polymeric Compound and the Monomeric Compound are Different from Each other in Core Structure, and Only the Monomeric Compound Has Smectic Liquid Crystallinity)

The side chain type copolymer of formula 37 and the liquid crystalline monomeric compound of formula 46 were blended together at a weight ratio of 5:1, and the blend was dissolved in dichloromethane.

Next, dichloromethane was evaporated at 40° C. and was then dried in vacuo again at 40° C. to give a side chain type polymeric compound/monomeric compound blend material 9 containing a monomeric compound content of 16.7% by weight.

(4C) Observation Under Polarization Microscope

For all the blend materials 7 to 9, independently of whether or not the added monomeric compound has liquid crystalline properties, a large number of domains having a size larger than the domains (order of several tens to several hundereds of micrometers) in the crystal phase observed under the polarization microscope of the above polymeric compound alone (not blended with the monomeric compound) were observed. For all the blend materials 7 to 9, by virtue of the presence of large domains, the liquid crystal phase could be easily confirmed, and the development of smectic phase could be confirmed. Further, the texture varied depending upon the cooling start temperature and the cooling rate.

The blend material thus obtained was allowed to stand on an iron plate and was rapidly cooled from a temperature zone, at which the smectic phase was exhibited, to a temperature around room temperature. As a result, textures reflecting the respective phases were observed. The cooling rate was not less than 50° C./min. When the cooling rate was not more than 20° C./min, a texture similar to a high-order smectic phase was observed.

(5C) Measurement of Stationary Photocurrent (20° C.)

In the same manner as described above, the presence or absence of photocurrent, and dark current and amperometric response in the case where DC voltage was applied were measured. The measurement results of the sample cooled at a rate of not less than 50° C./min were compared with the measurement results of the sample cooled at a rate of 0.1° C./min. As a result, the difference in cooling rate did not cause a significant change in waveform, as well as in intensity.

(6C) Time-of-Flight Measurement (Liquid Crystal State at High Temperature)

For the blend materials 7 to 9, the hole mobility was determined from the transient photocurrent in the smectic phase and was found to be about $2.0 \times 10^{-4}$ cm$^2$/V·s to $1.0 \times 10^{-2}$ cm$^2$/V·s. This value was about one-half to one-third of the measured value for the polymeric compound alone (not blended with the monomeric compound).

(7C) Time-of-Flight Measurement (Rapidly Cooling Condition)

The blend materials 7 to 9 were cooled from 140° C. to 30° C. at a cooling rate of not less than 50° C./min to prepare liquid crystal glass state samples. The charge mobility of these samples at a temperature around room temperature was about $1.0 \times 10^{-3}$ cm$^2$/V·s which was substantially the same as the charge mobility in the SmB phase state.

(8C) Time-of-Flight Measurement (Gradual Cooling Condition)

The blend materials 7 to 9 were cooled from 140° C. to 30° C. at a cooling rate of 1° C./min to prepare crystal state samples. The charge mobility of these samples was $4.0 \times 16^{-4}$ cm$^2$/V·s The above organic semiconductor materials (polymeric compound/monomeric compound blend material) were gradually cooled in contact with an aligning film from the liquid crystal phase to prepare samples having a crystal structure having large domains or a structure similar to a high-order smectic phase. Due to increased domain size, the charge mobility became $1.0 \times 10^{-3}$ cm$^2$/V·s.

(1D) Blend of Main Chain Type Polymeric Compound/Monomeric Compound (Where the Main Chain Type Polymeric Compound and the Monomeric Compound are Different from Each other Core Structure)

The main chain type polymeric compound of formula 39 which exhibits a smectic phase and the monomeric compound of formula 43 which exhibits a smectic phase were blended together at a weight ratio of 5:1, and the blend was dissolved in hot toluene.

Next, toluene was evaporated at 110° C. and was then dried in vacuo at 80° C. to give a main chain type polymeric compound/monomeric compound blend material 10 containing a monomeric compound content of 16.7% by weight.

(2D) Main Chain Type Polymeric Compound/Monomeric Compound (Where the main Chain Type Polymeric Compound and the Monomeric Compound are Different from Each other in Core Structure, and Only the Polymeric Compound Has Smectic Liquid Crystallinity)

The main chain type polymeric compound of formula 39 which exhibits a smectic phase and the monomeric compound of formula 44 which does not exhibit a smectic phase were blended together at a weight ratio of 5:1, and the blend was dissolved in hot toluene.

Next, toluene was evaporated at 110° C. and was then dried in vacuo at 80° C. to give a main chain type polymeric compound/monomeric compound blend material 11 containing a monomeric compound content of 16.7% by weight.

(3D) Main Chain Type Polymeric Compound/Monomeric Compound (Where the Main Chain Type Polymeric Compound and the Monomeric Compound are Different from each other in Core Structure, and the Polymeric Compound does not Exhibit a Smectic Phase)

The main chain type polymeric compound of formula 38 and the liquid crystalline monomeric compound of formula 43 were blended together at a weight ratio of 5:1, and the blend was dissolved in hot toluene.

Next, toluene was evaporated at 110° C. and was then dried in vacuo at 80° C. to give a main chain type polymeric compound/monomeric compound blend material 12 containing a monomeric compound content of 16.7% by weight.

(4D) Observation Under Polarization Microscope

It was confirmed that all the main chain type polymeric compound/monomeric compound blend materials 10 to 12 in this Example exhibited a smectic phase even in the case where the polymeric compound alone did not exhibit a smectic phase.

(5D) Measurement of Stationary Photocurrent

In the same manner as described above, the presence or absence of photocurrent, and dark current and amperometric response in the case where DC voltage was applied were measured. The measurement results of the sample cooled at a rate of not less than 50° C./min were compared with the measurement results of the sample cooled at a rate of 0.1° C./min. As a result, the difference in cooling rate did not cause a significant change in waveform, as well as in intensity.

(6D) Time-of-Flight Measurement (Liquid Crystal State at High Temperature)

The hole mobility was determined from the transient photocurrent in the two smectic phases in the liquid crystal polymeric compound blend and was found to be about $2.0 \times 10^{-4}$ cm²/V·s to $3.0 \times 10^{-3}$ cm²/V·s. This value was about one-half to one-third of the measured value for the polymeric compound alone (not blended with the monomeric compound).

(7D) Time-of-Flight Measurement (Rapidly Cooling Condition)

The blend materials 10 to 12 were cooled from 150° C. to 30° C. at a cooling rate of not less than 50° C./min to prepare liquid crystal glass state samples. The mobility of these samples at a temperature around room temperature was about $3.0 \times 10^{-3}$ cm²/V·s which was substantially the same as the charge mobility in the smectic phase state.

(8D) Time-of-Flight Measurement (Gradual Cooling Condition)

The blend materials 10 to 12 were cooled from 150° C. to 30° C. at a rate of 1° C./min, and the charge mobility of these samples was $5.0 \times 10^{-6}$ cm²/V·s.

The above organic semiconductor materials (blends) were gradually cooled in contact with an aligning film from the liquid crystal phase to prepare samples having a crystal structure having large domains or a structure similar to a high-order Sm phase. Due to increased domain size, the charge mobility became $3.0 \times 10^{-3}$ cm²/V·s.

The invention claimed is:

1. An organic semiconductor device comprising a substrate, a gate electrode, a gate insulating layer, an organic semiconductor layer, a drain electrode, and a source electrode, said organic semiconductor layer being formed of the organic semiconductor material wherein the organic semiconductor material comprises a polymeric compound and a monomeric compound, said polymeric compound having a side chain comprising a core structure a core structure comprising a π electron ring selected from a group consisting of L 6π electron rings, M 8π electron rings, N 10π electron rings, O 12π electron rings, P 14π electron rings, Q 16π electron rings, R 18π electron rings, S 20π electron rings, T 22π electron rings, U 24π electron rings, and V 26π electron rings, wherein L, M, N, O, P, Q, R, S, T, U, and V are each an integer of 0 (zero) to 6 and L+M+N+O+P+Q+R+S+T+U+V=1 to 6, said monomeric compound having the core structure and at least one of a first terminal group in one end of the core structure and a second terminal group in an other end of the core structure being capable of developing liquid crystallinity, wherein the molar ratio of the monomeric compound to the polymeric compound is 1:1 to 1:100, the core structure is selected from the group consisting of structures represented by the following formula:

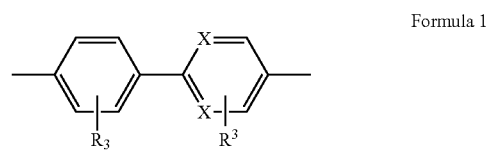

Formula 1

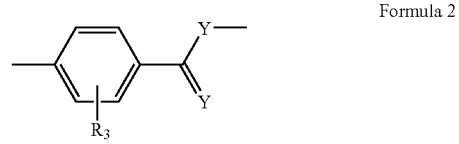

Formula 2

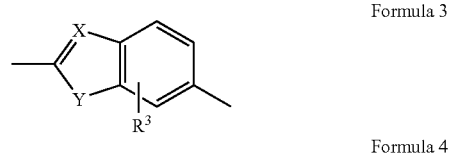

Formula 3

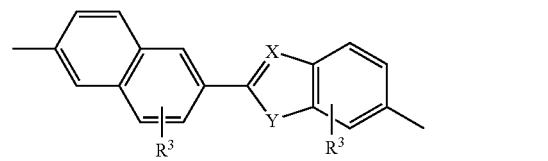

Formula 4

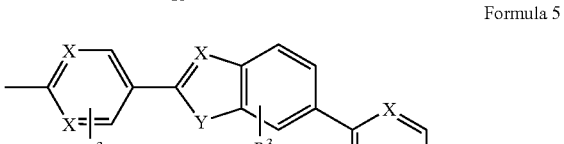

Formula 5

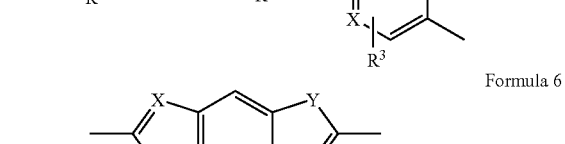

Formula 6

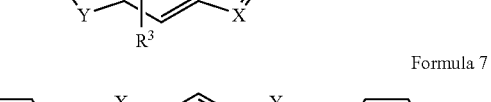

Formula 7

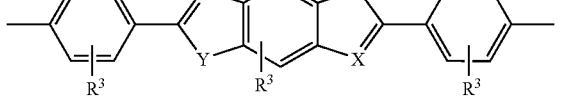

Formula 8

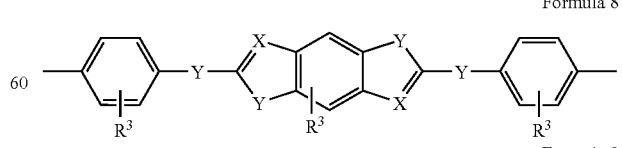

Formula 9

Formula 10
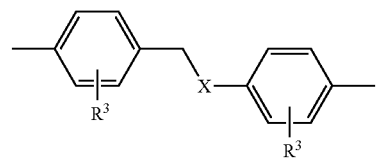
Formula 11
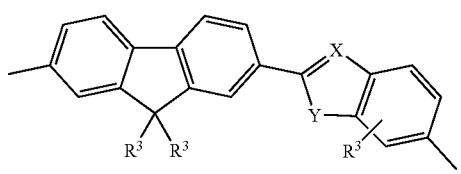
Formula 12
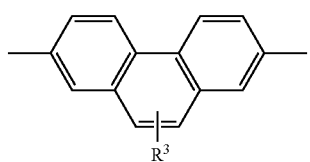
Formula 13
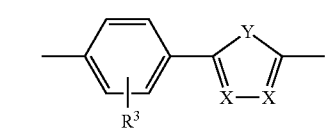
Formula 14
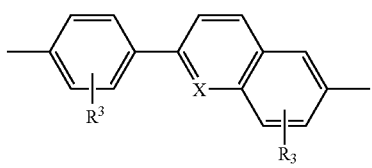
Formula 15
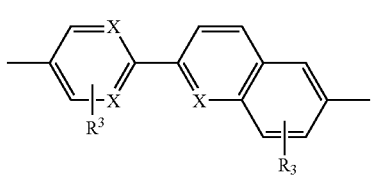
Formula 16
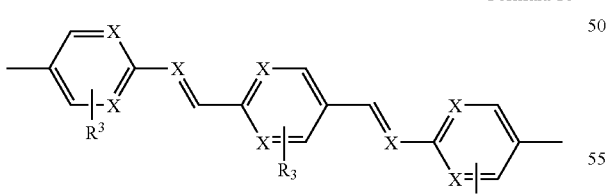
Formula 17
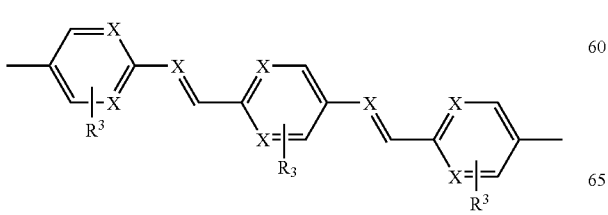
Formula 18
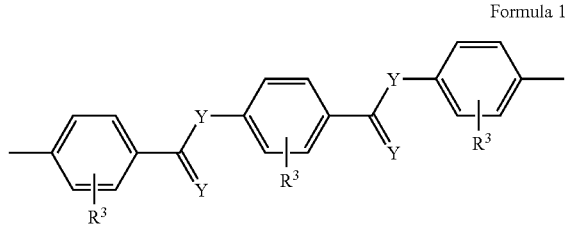
Formula 19
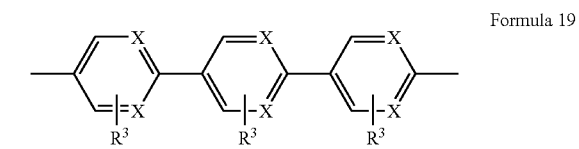
Formula 20
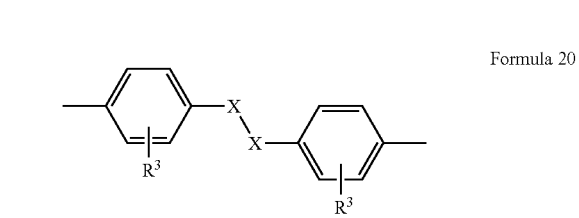
Formula 21
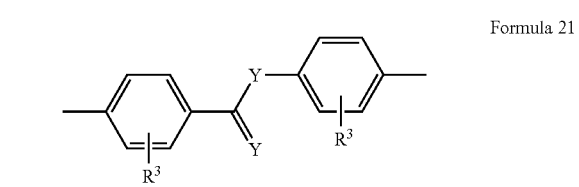
Formula 22
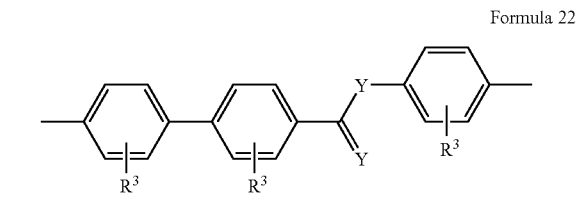
Formula 23
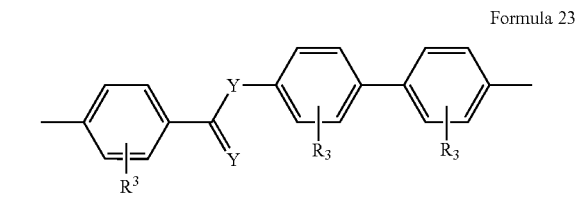
Formula 24
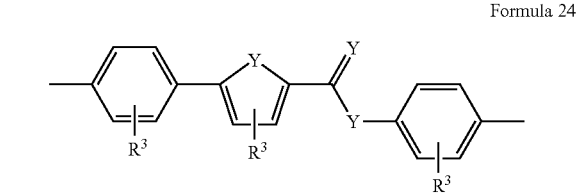
Formula 25
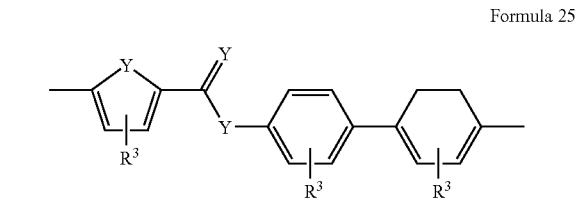

-continued

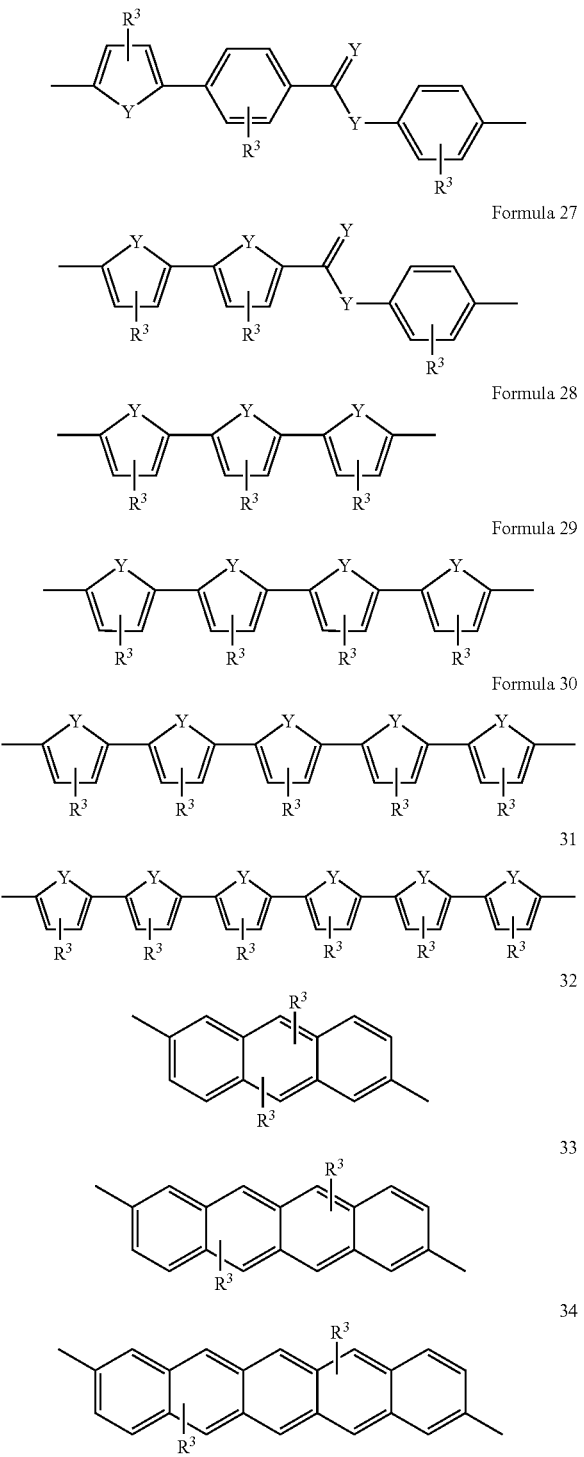

wherein
R³'s which may be the same or different, represent a trifluoromethyl group, an alkyl group, a nitro group, a halogen atom, or a hydrogen atom;
X represents CH or N; and
Y represents S or O, the first terminal group in the one end of the core structure is a hydrogen atom, a halogen atom, a cyano group, a nitro group or a hydroxyl group, the second terminal group in the other end of the core structure is a substituted or unsubstituted alkyl group, a substituted or unsubstituted alkylthio group, a substituted or unsubstituted alkoxyl group, a substitute or unsubstituted alkoxycarbonyl group, or a substituted or unsubstituted alkylcarbonyl group, and the organic semiconductor material is anisotropically oriented in such a direction that, in the core structure, the direction of the overlap of electron orbits is coincident with a charge transport direction.

2. The organic semiconductor device according to claim 1, wherein the π electron ring of said core in the side chain of said polymeric compound is the same as the π electron ring of said core of said monomeric compound.

3. The organic semiconductor device according to claim 1, wherein said monomeric compound has at least one smectic liquid crystal phase state at a temperature below the heat decomposition temperature.

4. The organic semiconductor device according to claim 1, wherein said polymeric compound has at least one smectic liquid crystal phase state at a temperature below the heat decomposition temperature.

5. The organic semiconductor device according to claim 1, wherein said organic semiconductor layer has an electron mobility of not less than $10^{-5}$ cm²/V·s or a hole transport mobility of not less than $10^{-5}$ cm²/V·s.

6. An organic semiconductor device comprising a substrate, a gate electrode, a gate insulating layer, an organic semiconductor layer, a drain electrode, and a source electrode, said organic semiconductor layer being formed of the organic semiconductor material comprising a polymeric compound and a monomeric compound, said polymeric compound having a main chain comprising a core structure comprising a π electron ring selected from a group consisting of L 6π electron rings, M 8π electron rings, N 10π electron rings, O 12π electron rings, P 14π electron rings, Q 16π electron rings, R 18π electron rings, S 20π electron rings, T 22π electron rings, U 24π electron rings, and V 26π electron rings, wherein L, M, N, O, P, Q, R, S, T, U, and V are each an integer of 0 (zero) to 6 and L+M+N+O+P+Q+R+S+T+U+V=1 to 6, said monomeric compound having the core structure and at least one of a first terminal group in one end of the core structure and a second terminal group in an other end of the core structure being capable of developing liquid crystallinity, wherein the molar ratio of the monomeric compound to the polymeric compound is 1:1 to 1:100, the core structure is selected from the group consisting of structures represented by the following formula:

Formula 1
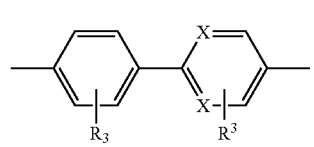

Formula 2
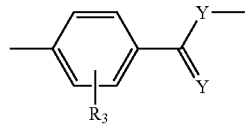

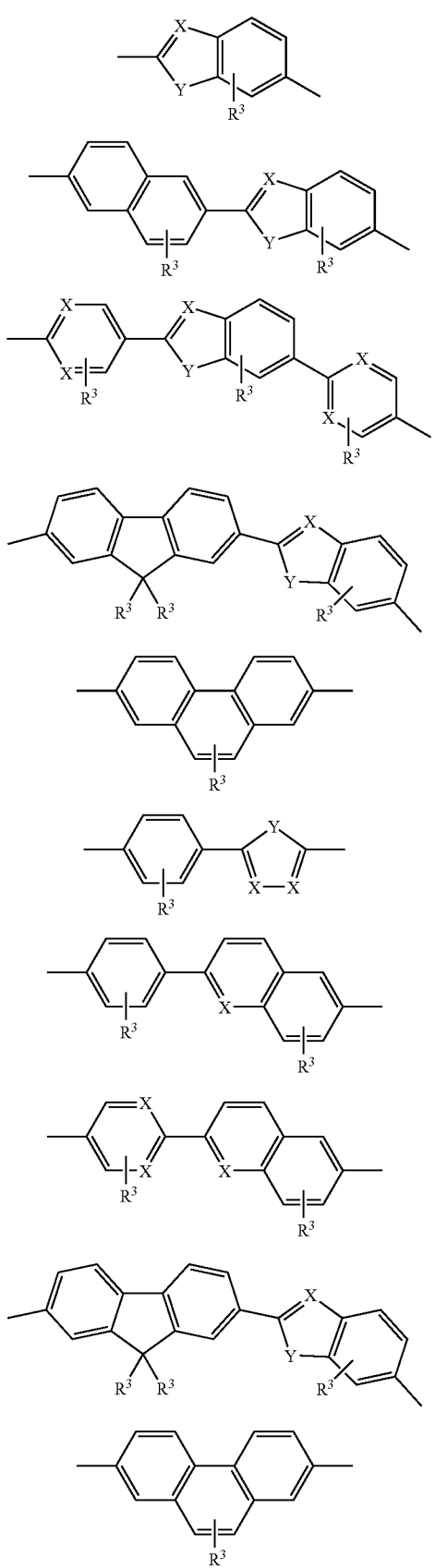
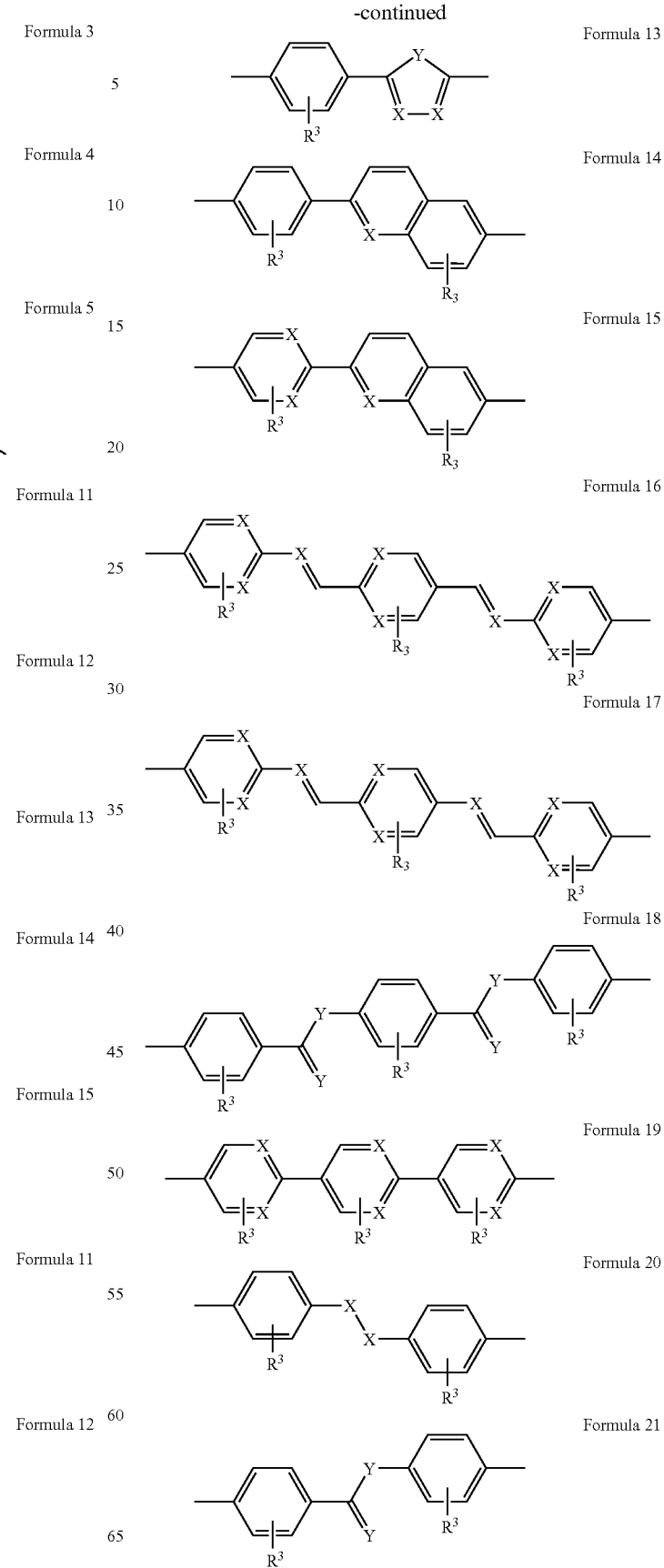

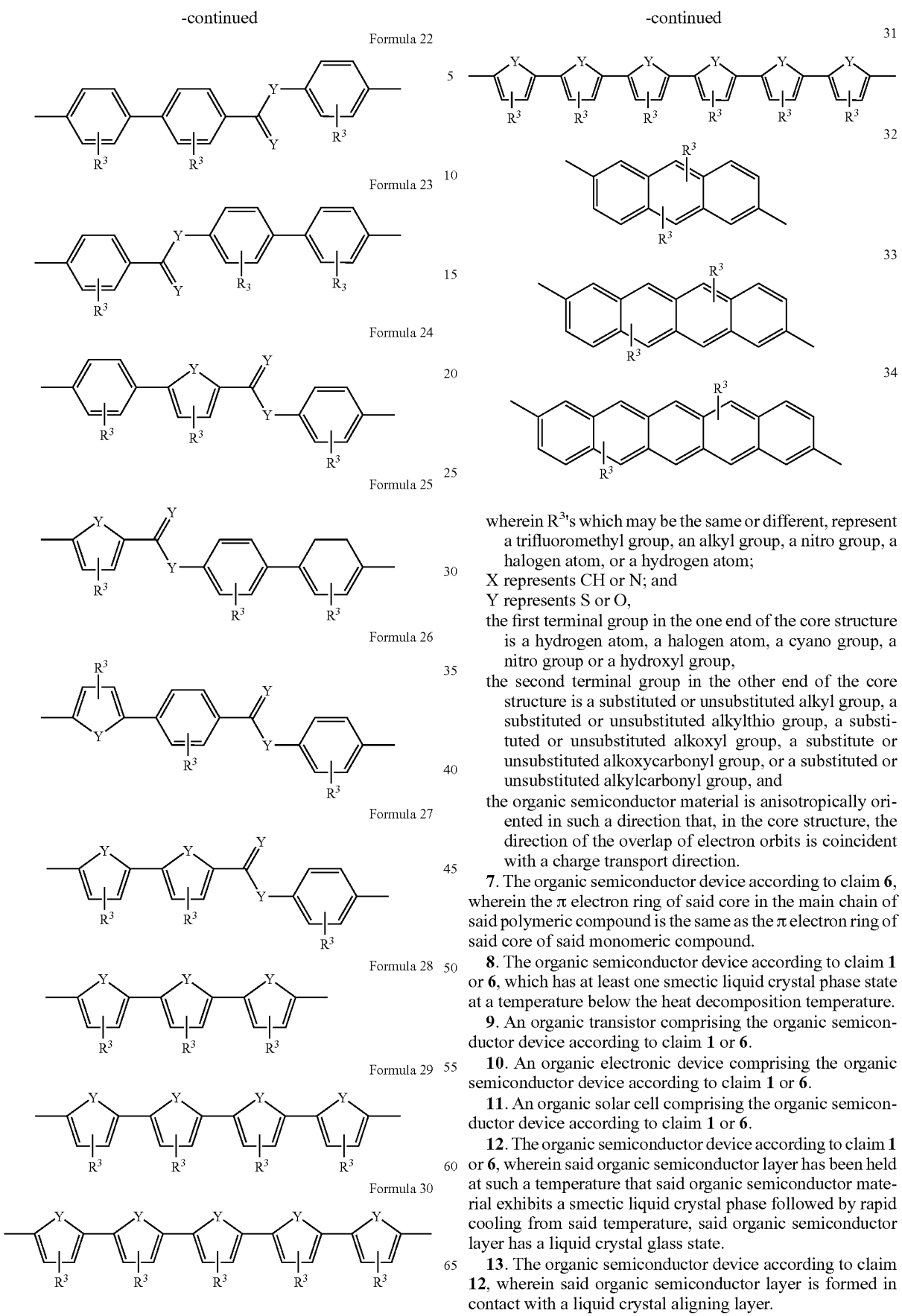

wherein $R^3$'s which may be the same or different, represent a trifluoromethyl group, an alkyl group, a nitro group, a halogen atom, or a hydrogen atom;

X represents CH or N; and

Y represents S or O, the first terminal group in the one end of the core structure is a hydrogen atom, a halogen atom, a cyano group, a nitro group or a hydroxyl group, the second terminal group in the other end of the core structure is a substituted or unsubstituted alkyl group, a substituted or unsubstituted alkylthio group, a substituted or unsubstituted alkoxyl group, a substitute or unsubstituted alkoxycarbonyl group, or a substituted or unsubstituted alkylcarbonyl group, and the organic semiconductor material is anisotropically oriented in such a direction that, in the core structure, the direction of the overlap of electron orbits is coincident with a charge transport direction.

7. The organic semiconductor device according to claim 6, wherein the π electron ring of said core in the main chain of said polymeric compound is the same as the π electron ring of said core of said monomeric compound.

8. The organic semiconductor device according to claim 1 or 6, which has at least one smectic liquid crystal phase state at a temperature below the heat decomposition temperature.

9. An organic transistor comprising the organic semiconductor device according to claim 1 or 6.

10. An organic electronic device comprising the organic semiconductor device according to claim 1 or 6.

11. An organic solar cell comprising the organic semiconductor device according to claim 1 or 6.

12. The organic semiconductor device according to claim 1 or 6, wherein said organic semiconductor layer has been held at such a temperature that said organic semiconductor material exhibits a smectic liquid crystal phase followed by rapid cooling from said temperature, said organic semiconductor layer has a liquid crystal glass state.

13. The organic semiconductor device according to claim 12, wherein said organic semiconductor layer is formed in contact with a liquid crystal aligning layer.

14. The organic semiconductor device according to claim 13, wherein the liquid crystal aligning layer is formed of a material selected from the group consisting of polychloropyrene, polyetehylene terephthalate, polyoxymethylene, polyvinyl chloride, poly(vinylidene fluoride), cyanoethyl pullulan, polymethyl methacrylate, polysulfone, polycarbonate, and polyimide and, due to the contact of said organic semiconductor material with said liquid crystal aligning layer, said organic semiconductor material is anisotropically oriented in a specific direction.

15. The organic semiconductor device according to claim 13, wherein the liquid crystal aligning layer is formed of a curing resin having fine concaves and convexes on its surfaces and, due to the contact of said organic semiconductor material with said liquid crystal aligning layer, said organic semiconductor material is anisotropically oriented in a specific direction.

16. The organic semiconductor device according to claim 13, wherein the liquid crystal aligning layer is formed of a substrate and a curing resin having fine concaves and convexes on its surfaces and, due to the contact of said organic semiconductor material with said liquid crystal aligning layer, said organic semiconductor material is anisotropically oriented in a specific direction.

17. The organic semiconductor device according to claim 1 or 6, wherein said organic semiconductor layer has been held at such a temperature that said organic semiconductor material exhibits a smectic liquid crystal phase followed by gradual cooling from said temperature, at least a part of said organic semiconductor layer has a crystal state.

18. The organic semiconductor device according to claim 17, wherein said organic semiconductor layer is formed in contact with a liquid crystal aligning layer.

19. The organic semiconductor device according to claim 18, wherein the liquid crystal aligning layer is formed of a material selected from the group consisting of polychloropyrene, polyetehylene terephthalate, polyoxymethylene, polyvinyl chloride, poly(vinylidene fluoride), cyanoethyl pullulan, polymethyl methacrylate, polysulfone, polycarbonate, and polyimide and, due to the contact of said organic semiconductor material with said liquid crystal aligning layer, said organic semiconductor material is anisotropically oriented in a specific direction.

20. The organic semiconductor device according to claim 18, wherein the liquid crystal aligning layer is formed of a curing resin having fine concaves and convexes on its surfaces and, due to the contact of said organic semiconductor material with said liquid crystal aligning layer, said organic semiconductor material is anisotropically oriented in a specific direction.

21. The organic semiconductor device according to claim 18, wherein the liquid crystal aligning layer is formed of a substrate and a curing resin having fine concaves and convexes on its surfaces and, due to the contact of said organic semiconductor material with said liquid crystal aligning layer, said organic semiconductor material is anisotropically oriented in a specific direction.

* * * * *